(12) United States Patent
Yamada et al.

(10) Patent No.: US 8,742,343 B2
(45) Date of Patent: Jun. 3, 2014

(54) CHARGED PARTICLE BEAM SYSTEM AND METHOD OF AXIAL ALIGNMENT OF CHARGED PARTICLE BEAM

(71) Applicant: Jeol Ltd., Tokyo (JP)

(72) Inventors: Mitsuru Yamada, Tokyo (JP); Motohiro Nakamura, Tokyo (JP)

(73) Assignee: Jeol Ltd., Tokyo (JP)

( * ) Notice: Subject to any disclaimer, the term of this patent is extended or adjusted under 35 U.S.C. 154(b) by 0 days.

(21) Appl. No.: 13/908,345

(22) Filed: Jun. 3, 2013

(65) Prior Publication Data

US 2013/0320210 A1    Dec. 5, 2013

(30) Foreign Application Priority Data

Jun. 4, 2012   (JP) ................................. 2012-127049

(51) Int. Cl.
   *H01J 37/26*   (2006.01)
(52) U.S. Cl.
   USPC ............ 250/310; 250/307; 250/309; 250/311
(58) Field of Classification Search
   USPC .................................. 250/307, 309, 310, 311
   See application file for complete search history.

(56) References Cited

U.S. PATENT DOCUMENTS

| | | | |
|---|---|---|---|
| 5,627,373 A * | 5/1997 | Keese | 250/310 |
| 6,838,667 B2 * | 1/2005 | Tsuneta et al. | 850/10 |
| 6,864,493 B2 * | 3/2005 | Sato et al. | 250/491.1 |
| 7,605,381 B2 * | 10/2009 | Sato et al. | 250/491.1 |
| 8,026,491 B2 * | 9/2011 | Ogashiwa et al. | 250/396 R |
| 8,563,926 B2 * | 10/2013 | Yamada et al. | 250/309 |
| 2008/0073583 A1 * | 3/2008 | Jasinski et al. | 250/492.21 |
| 2010/0006755 A1 * | 1/2010 | Sato et al. | 250/307 |

FOREIGN PATENT DOCUMENTS

| | | |
|---|---|---|
| JP | 6176721 A | 6/1994 |
| JP | 2005174812 A | 6/2005 |

* cited by examiner

*Primary Examiner* — Michael Logie
(74) *Attorney, Agent, or Firm* — The Webb Law Firm

(57) ABSTRACT

A method of axially aligning a charged particle beam involves an image data acquisition step and a calculation step. The image data acquisition step consists of obtaining first to third sets of image data by scanning a shielding member placed in the path of the beam with the beam while varying conditions of the excitation currents through first and second alignment coils, respectively. The calculation step consists of calculating the values of the excitation currents through the first and second alignment coils, respectively, for axial alignment of the beam, based on the obtained first to third sets of image data.

18 Claims, 16 Drawing Sheets

| FRAME | VALUE OF EXCITATION CURRENT THROUGH X ALIGNMENT COIL | VALUE OF EXCITATION CURRENT THROUGH Y ALIGNMENT COIL |
|---|---|---|
| FRAME 1 | X0 | Y0 |
| FRAME 2 | X0 | Y0+Δ2 |
| FRAME 3 | X0+Δ1 | Y0 |

| FRAME | VALUE OF EXCITATION CURRENT THROUGH X ALIGNMENT COIL | VALUE OF EXCITATION CURRENT THROUGH Y ALIGNMENT COIL | SCAN COIL USED TO SCAN THE CHARGED PARTICLE BEAM |
|---|---|---|---|
| FRAME 1 | X0 | Y0 | S1 |
| FRAME 2 | X0 | Y0+Δ2 | S1 |
| FRAME 3 | X0+Δ1 | Y0 | S1 |
| FRAME 4 | X0 | Y0 | S2 |
| FRAME 5 | X0 | Y0+Δ2 | S2 |
| FRAME 6 | X0+Δ1 | Y0 | S2 |

CHARGED PARTICLE BEAM SYSTEM AND METHOD OF AXIAL ALIGNMENT OF CHARGED PARTICLE BEAM

BACKGROUND OF THE INVENTION

1. Field of the Invention

The present invention relates to a method of axially aligning a charged particle beam and also to a charged particle beam system.

2. Description of Related Art

In recent years, scanning electron microscopes for making observations and measurements on fine structures of living organisms, materials, semiconductors, and so on and charged particle beam systems such as metrology SEMs used for measurements on semiconductor device circuit patterns have become known.

In such a charged particle beam system, the axis of a charged particle beam is aligned with the optical axis of an optical member such as an objective lens.

For example, JP-A-6-176721 discloses an aligner for aligning the electron beam of a scanning electron microscope. The aligner comprises means for obtaining two filament images by controlling a condenser lens/scan coil under two sets of conditions, means for obtaining two-valued images by binarizing the two original images, a histogram creating means for obtaining a histrogram by histrogramming the two-valued images in the X- and Y-directions, means for finding two coordinates indicating a maximum value from the histogram, and means for controlling the excitation current through the alignment coil such that the distance between the two coordinates is brought to within a tolerable range.

JP-A-2005-174812 discloses a scanning electron microscope in which the axis of a charged particle beam is adjusted based on the result of a comparison between first and second images after detecting the first image by scanning the aperture of an objective lens with an electron beam in a first direction and detecting the second image by scanning the aperture of the objective lens with the beam in a second direction opposite to the first direction.

In the aligner of JP-A-6-176721, however, the excitation currents through the gun alignment coils need to be corrected repetitively until the distance between the coordinates that maximizes the two-valued images derived from filament images fall within a tolerable range.

Furthermore, in the scanning electron microscope of JP-A-2005-174812, a sequence of manipulative operations needs to be carried out repetitively until the excitation currents through the beam alignment coils reach their optimum value.

SUMMARY OF THE INVENTION

In view of the foregoing problems, the present invention has been made. One object associated with some aspects of the present invention is to offer a method of easily making axial alignment of a charged particle beam.

Another object associated with some aspects of the invention is to offer a charged particle beam system capable of easily making axial alignment of a charged particle beam.

(1) A method of making axial alignment of a charged particle beam in accordance with the present invention is implemented by a charged particle beam system having a first alignment coil for deflecting the beam in a first direction, a second alignment coil for deflecting the beam in a second direction crossing the first direction and an objective lens for focusing the beam onto an object, and operating to adjust the axis of the beam by means of the first and second alignment coils, to detect a signal emanating from the object and to obtain image data. The method starts with obtaining at least first to third sets of image data by scanning the beam on a scanning area including a shielded region and repeating the scanning while varying conditions of excitation currents flowing through the first and second alignment coils, respectively. The values of the excitation currents through the first and second alignment coils, respectively, for axial alignment of the beam are calculated based on the obtained first to third sets of image data. During the step of obtaining the at least first to third sets of image data, the first set of image data is obtained under conditions where the values of the excitation current through the first alignment coil is a first current value and where the value of the excitation current through the second alignment coil is a second current value. The second set of image data is obtained under conditions where the value of the excitation current through the first alignment coil is the first current value and where the value of the excitation current through the second alignment coil is a current value obtained by varying the second current value by a second incremental amount of current. The third set of image data is obtained under conditions where the value of the excitation current through the first alignment coil is a current value obtained by varying the first current value by a first incremental amount of current and where the value of the excitation current through the second alignment coil is the second current value.

In this method of axial alignment of a charged particle beam, the values of the excitation currents through the first and second alignment coils, respectively, for axial alignment of the charged particle beam can be found from the three sets of image data. Since only a limited number of sets of image data need to be obtained for axial alignment of the beam in this way, it is easy to axially align the beam. This reduces the burden on the operator of the system. The time taken to axially align the beam can be shortened.

(2) Another method of making axial alignment of a charged particle beam is based on the method (1) above and further characterized in that, during said step of calculating values of the excitation currents, a first image displacement vector indicative of an amount of positional deviation between a first image formed by the shielded region and indicated by the first set of image data and an image obtained by rotating the first image through 180 degrees about an image center, a second image displacement vector indicative of an amount of positional deviation between a second image formed by the shielded region and indicated by the second set of image data and an image obtained by rotating the second image through 180 degrees about an image center, and a third image displacement vector indicative of an amount of positional deviation between a third image formed by the shielded region and indicated by the third set of image data and an image obtained by rotating the third image through 180 degrees about an image center. The values of the excitation currents through the first and second alignment coils, respectively, for axial alignment of the charged particle beam may be calculated based on the first to third image displacement vectors.

(3) A further method of making axial alignment of a charged particle beam is based on the method (1) above and further characterized in that the charged particle beam system has scan coils for scanning the charged particle beam when the image data are obtained and that fourth to sixth sets of image data are obtained during the step of obtaining the at least first to third sets of image data. The fourth set of image data is obtained under conditions where the value of the excitation current through the first alignment coil is the first current value and where the value of the excitation current through the second alignment coil is the second current value. The fifth set of image data is obtained under conditions where the value of the excitation current through the first alignment coil is the first current value and where the value of the excitation current through the second alignment coil is a current value obtained by varying the second current value by the second incremental amount of current. The sixth set of image data is obtained under conditions where the value of the excitation current through the first alignment coil is a current value obtained by varying the first current value by the first incremental amount of current and where the value of the excitation current through the second alignment coil is the second current value. The first to third sets of image data are obtained by scanning the charged particle beam in a first scanning direction by means of the scan coils. The fourth to sixth sets of image data are obtained by scanning the beam in a second scanning direction opposite to the first scanning direction by means of the scan coils. During the step of calculating the values of the excitation currents, the values of the excitation currents through the first and second alignment coils, respectively, for axial alignment of the beam may be calculated based on the first to sixth sets of image data.

(4) An additional method of axial alignment of a charged particle beam is based on any one of (1)-(3) above and further characterized in that the objective lens has an aperture for permitting passage of the charged particle beam and that the shielded region may be formed by the objective lens.

(5) A still further method of axial alignment of a charged particle beam is based on any one of (1)-(3) above and further characterized in that the shielded region may be formed by an orifice for creating a pressure difference between a space where the objective lens is placed and a space where a sample is placed.

(6) A yet other method of axial alignment of a charged particle beam is based on any one of (1)-(3) above and further characterized in that the shielded region may be formed by an objective aperture for restricting the charged particle beam impinging on the objective lens.

(7) A yet additional method of axial alignment of a charged particle beam is based on any one of (1)-(3) above and further characterized in that the shielded region may be formed by a charged particle beam detection aperture for detecting variations in the charged particle beam.

(8) A still further method of axial alignment of a charged particle beam is based on any one of (1)-(7) above and further characterized in that the first and second alignment coils may be placed at an upstream-side from an objective aperture for restricting the charged particle beam traveling for the objective lens.

(9) A further additional method of axial alignment of a charged particle beam is based on any one of (1)-(5) above and further characterized in that the first and second alignment coils may be placed at a downstream-side from an objective aperture for restricting the charged particle beam traveling for the objective lens.

(10) A charged particle beam system associated with the present invention has a first alignment coil for deflecting a charged particle beam in a first direction, a second alignment coil for deflecting the beam in a second direction crossing the first direction and an objective lens for focusing the beam onto an object, and operates to adjust the axis of the beam by means of the first and second alignment coils, to detect a signal emanating from the object and to obtain image data. The charged particle beam system comprises: image data acquisition means for obtaining at least first to third sets of image data by scanning the beam on a scanning area including a shielded region and repeating the scanning while varying conditions of excitation currents through the first and second alignment coils, respectively; and calculation means for calculating the values of the excitation currents through the first and second alignment coils, respectively, for axial alignment of the beam based on the first to third sets of image data obtained by the image data acquisition means. The first set of image data is obtained under conditions where the value of the excitation current through the first alignment coil is a first current value and where the value of the excitation current through the second alignment coil is a second current value. The second set of image data is obtained under conditions where the value of the excitation current through the first alignment coil is the first current value and where the value of the excitation current through the second alignment coil is a current value obtained by varying the second current value by a second incremental amount of current. The third set of image data is obtained under conditions where the value of the excitation current through the first alignment coil is a current value obtained by varying the first current value by a first incremental amount of current and where the value of the excitation current through the second alignment coil is the second current value.

With this charged particle beam system, the values of the excitation currents through the first and second alignment coils, respectively, for axial alignment of the charged particle beam can be found from the three sets of image data. Since only a limited number of sets of image data are required to be obtained for axial alignment of the beam in this way, it is easy to axially align the beam. This reduces the burden on the operator of the system. The time taken to make axial alignment of the beam can be shortened.

(11) Another charged particle beam system associated with the present invention is based on the system of (10) above and further characterized in that the calculation means calculates a first image displacement vector indicative of an amount of positional deviation between a first image formed by the shielded region and indicated by the first set of image data and an image obtained by rotating the first image through 180 degrees about an image center, a second image displacement vector indicative of an amount of positional deviation between a second image formed by the shielded region and indicated by the second set of image data and an image obtained by rotating the second image through 180 degrees about an image center, and a third image displacement vector indicative of an amount of positional deviation between a third image formed by the shielded region and indicated by the third set of image data and an image obtained by rotating the third image through 180 degrees about an image center. The values of the excitation currents through the first and second alignment coils, respectively, for axial alignment of the charged particle beam may be calculated based on the first to third image displacement vectors.

(12) A further charged particle beam system associated with the present invention is based on the system (10) above and further characterized in that the system further includes scan coils for scanning the charged particle beam when the image data are obtained and that the image data acquisition means obtains fourth to sixth sets of image data. The fourth set of image data is obtained under conditions where the value of the excitation current through the first alignment coil is the first current value and where the value of the excitation current through the second alignment coil is the second current value. The fifth set of image data is obtained under conditions where the value of the excitation current through the first alignment coil is the first current value and where the value of the excitation current through the second alignment coil is a current value obtained by varying the second current value by the second incremental amount of current. The sixth set of image data is obtained under conditions where the value of the excitation current through the first alignment coil is a current value obtained by varying the first current value by the first incremental amount of current and where the value of the excitation current through the second alignment coil is the second current value. The first to third sets of image data are obtained by scanning the charged particle beam in a first scanning direction using the scan coils. The fourth to sixth sets of image data are obtained by scanning the beam in a second scanning direction opposite to the first scanning direction using the scan coils. The calculation means may calculate the values of the excitation currents through the first and second alignment coils, respectively, for axial alignment of the beam based on the first to sixth sets of image data.

(13) A further charged particle beam system associated with the present invention is based on any one of (10)-(12) above and further characterized in that the objective lens has an aperture for permitting passage of the charged particle beam and that the shielded region may be formed by the objective lens.

(14) An additional charged particle beam system associated with the present invention is based on any one of (10)-(12) above and further characterized in that the shielded region may be formed by an orifice for creating a pressure difference between a space where the objective lens is placed and a space where a sample is placed.

(15) A yet other charged particle beam system associated with the present invention is based on any one of (10)-(12) above and further characterized in that the shielded region may be formed by an objective aperture for restricting the charged particle beam impinging on the objective lens.

(16) A still other charged particle beam system associated with the present invention is based on any one of (10)-(12) above and further characterized in that the shielded region may be formed by a charged particle beam detection aperture for detecting variations in the charged particle beam.

(17) An additional charged particle beam system associated with the present invention is based on any one of (10)-(16) above and further characterized in that the first alignment coil and the second alignment coil may be disposed at an upstream-side from an objective aperture for restricting the charged particle beam impinging on the objective lens.

(18) An additional charged particle beam system associated with the present invention is based on any one of (10)-(14) above and further characterized in that the first alignment coil the second alignment coil may be disposed at a downstream-side from objective aperture for restricting the charged particle beam impinging on the objective lens.

DESCRIPTION OF THE INVENTION

The preferred embodiments of the present invention are hereinafter described in detail with reference to the drawings. It is to be understood that embodiments described below do not unduly restrict the contents of the invention delineated by the appended claims and that all the configurations described below are not always essential constituent components of the present invention.

1. First Embodiment 1.1. Configuration of Charged Particle Beam System

Figure 1:
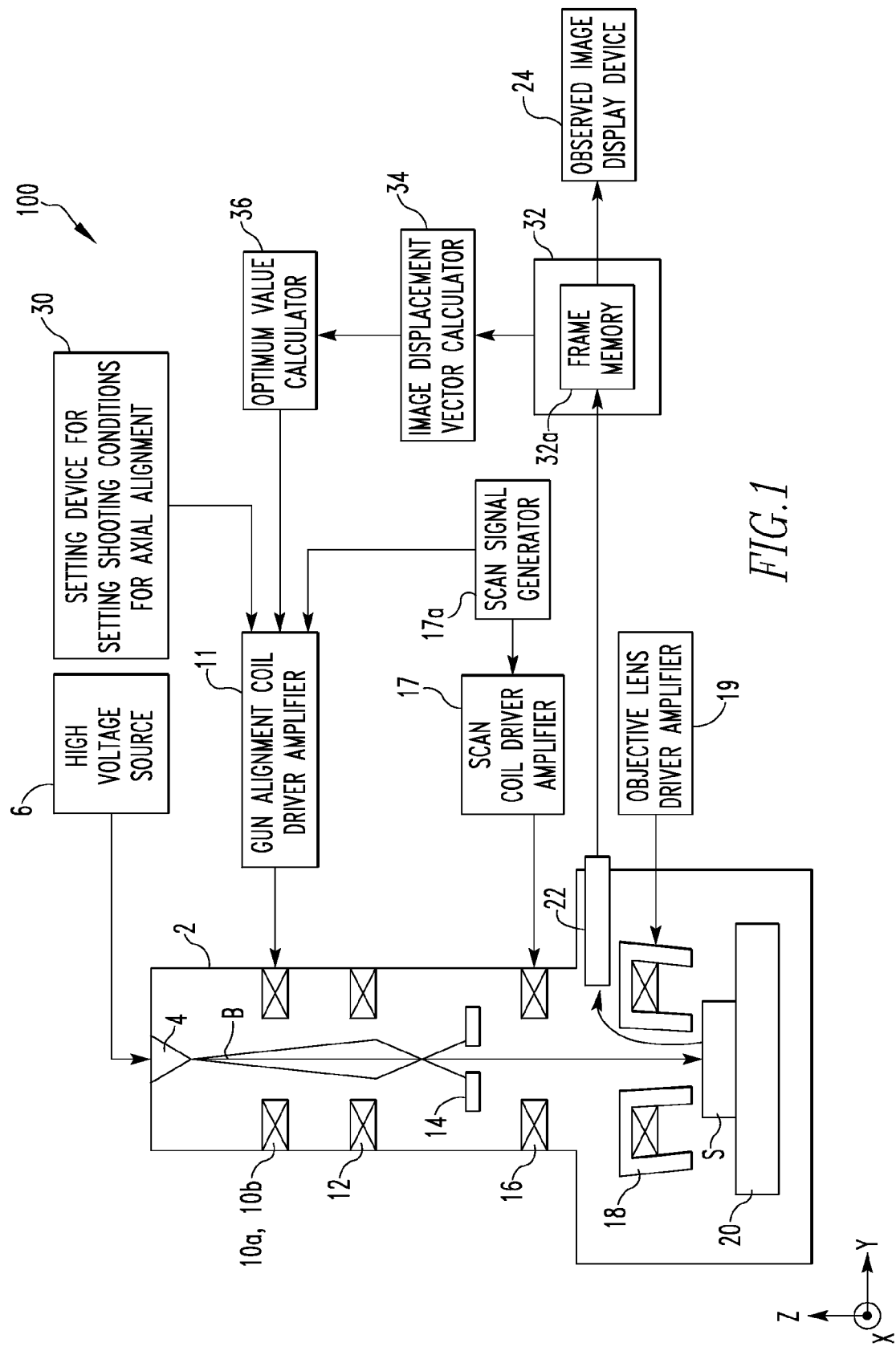
FIG. 1 is a block diagram of a charged particle beam system associated with a first embodiment of the present invention, showing the configuration of the system.

The configuration of a charged particle beam system associated with a first embodiment of the present invention is first described. Referring to FIG. 1, the system is generally indicated by reference numeral 100, and it is assumed that the system 100 is a scanning electron microscope (SEM).

As shown in FIG. 1, the charged particle beam system 100 is configured, including within optics column 2, a charged particle beam source 4, a high voltage source 6 for generating an accelerating voltage, an X gun alignment coil 10a, a Y gun alignment coil 10b, a gun alignment coil driver amplifier 11, condenser lenses 12, an objective aperture 14, a scan coil 16, a scan coil driver amplifier 17, a scan signal generator 17a, an objective lens 18, an objective lens driver amplifier 19, a sample stage 20, a detector 22, an observed image display device 24, a setting device 30 for setting shooting conditions for axial alignment, a memory 32 (including a frame memory 32a), an image displacement vector calculator 34, and an optimum value calculator 36.

The charged particle beam system 100 adjusts the axis of the charged particle beam B by the X gun alignment coil 10a for deflecting the beam B in the X direction and the Y gun alignment coil 10b for deflecting the beam B in the Y direction. Also, the system focuses the beam B onto an object (such as a sample S) by the objective lens 18, detects signals emanating from the illuminated object, and obtains image data.

For example, the charged particle beam source 4 is made of a well-known electron gun. The beam source 4 accelerates electrons released from a cathode by means of an anode and releases the charged particle beam B (such as an electron beam). No restrictions are imposed on the electron gun used as the charged particle beam source 4. For instance, an electron gun such as a tungsten filament thermionic gun, thermal-field-emission gun, or cold-field-emission gun can be used.

The high voltage source 6 for generating the accelerating voltage applies this voltage to the charged particle beam source 4 to accelerate electrons released from the cathode.

The X gun alignment coil 10a (one example of first alignment coil) and the Y gun alignment coil 10b (one example of second alignment coil) are disposed at a downstream-side from the beam source 4, i.e., located downstream along the beam B. In the illustrated example, the alignment coils are spaced from the beam source 4 along the −Z-direction. Placed at an upstream-side means that the alignment coils are located more upstream along the beam B, i.e., are shifted in the +Z-direction in the illustrated example. The gun alignment coils 10a and 10b are positioned between the beam source 4 and the condenser lenses 12.

The X gun alignment coil 10a has coils of one set opposite along the X-direction and can deflect the beam B in the X-direction (first direction). The Y gun alignment coil 10b has coils of one set opposite along the Y-direction (second direction) crossing or perpendicular to the X-direction and can deflect the beam B in the Y-direction. The beam B can be deflected in two dimensions by the X gun alignment coil 10a and Y gun alignment coil 10b. The Z-direction perpendicular to the X- and Y-directions is taken, for example, along the optical axis of the objective lens 18. The excitation currents through the gun alignment coils 10a and 10b are supplied from the gun alignment coil driver amplifier 11. The deflection of the beam B in a charged particle beam optics column 2 can be controlled in two dimensions by controlling the amounts of the excitation currents flowing through the gun alignment coils 10a and 10b. Consequently, the axis of the beam B can be adjusted.

As long as the charged particle beam B can be deflected in two dimensions, the direction in which the beam is deflected by the X gun alignment coil 10a and the direction in which the beam is deflected by the Y gun alignment coil 10b do not need to be perpendicular to each other.

The condenser lenses 12 are located behind the gun alignment coils 10a and 10b and can focus the beam B released from the charged particle beam source 4. The probe diameter and probe current can be controlled by the condenser lenses 12. The condenser lenses 12 converge the beam B such that a crossover exists at an upstream-side from the objective aperture 14.

The objective aperture 14 is located at a downstream-side from the condenser lenses 12 and in the path of the beam B.

The aperture 14 is provided with an aperture hole permitting passage of the beam B. An axis passing through the center of the aperture hole is the central axis (optical axis) of the objective aperture 14, which restricts the beam B impinging on the objective lens 18. For example, the objective aperture 14 passes only those of the particles of the beam B which travel for the objective lens 18 and which are present near the optical axis of the objective lens 18, and blocks the other particles.

The scan coil 16 which is made of an electromagnetic coil to scan the charged particle beam B is located at a downstream-side from the objective aperture 14. The scan coil 16 can deflect the beam B in the X- and Y-directions and thus can scan the beam B in two dimensions. The scan coil 16 scans the beam B in response to a scan coil driver signal from the scan coil driver amplifier 17. The scan signal generator 17a is connected with the scan coil driver amplifier 17 and supplies a generated scan signal to the scan coil driver amplifier 17. As a result, the generator operates the scan coil 16. During axial alignment of the beam B, the scan signal generator 17a can supply the generated scan signal to the gun alignment coil driver amplifier 11.

The objective lens 18 is located at a downstream-side from the scan coil 16 and focuses the charged particle beam B onto the surface of the sample S. The objective lens 18 is connected with the objective lens driver amplifier 19. The excitation current through the objective lens 18 is supplied from the objective lens driver amplifier 19. The objective lens 18 is provided with a through-hole (aperture) permitting passage of the beam B. The objective lens 18 acts on the beam B passing through the aperture. The optical axis of the objective lens 18 passes through the center of the through-hole.

The sample stage 20 physically supports the sample S and can move the sample S horizontally, up and down, rotate it, and tilt it.

The charged particle beam source 4, X gun alignment coil 10a, Y gun alignment coil 10b, condenser lenses 12, objective aperture 14, scan coil 16, and objective lens 18 are housed in the charged particle beam optics column 2.

The detector 22 detects secondary electrons or backscattered electrons released from the surface of the sample S in response to the scanning with the focused charged particle beam B. An intensity signal delivered from the detector 22 in response to the detected secondary electrons or backscattered electrons is stored as image data synchronized with the scanning signal for the beam B into the frame memory 32a. During scanning with the beam B, excitation currents based on the scanning signal are supplied to the scan coil 16.

In the illustrated example, the detector 22 is located at an upstream-side from the objective lens 18. Alternatively, the detector may be positioned at a downstream-side from the objective lens 18.

The memory 32 has the frame memory 32a for storing image data. Furthermore, the memory 32 can store shooting conditions under which image data are taken.

The observed image display device 24 displays an SEM image based on the image data stored in the frame memory 32a.

The setting device 30 for setting shooting conditions for axial alignment can derive image data while varying conditions of the excitation currents through the gun alignment coils 10a and 10b. In particular, the setting device 30 can control the excitation currents through the gun alignment coils 10a and 10b, take plural frames of images while varying the shooting conditions, and store image data and shooting conditions in the memory 32. The setting device 30 is connected with the gun alignment coil driver amplifier 11 and controls the excitation currents through the gun alignment coils 10a and 10b via the gun alignment coil driver amplifier 11.

The image displacement vector calculator 34 and optimum value calculator 36 (one example of calculation means) calculate the value of the excitation current through the X gun alignment coil 10a and the value of the excitation current through the Y gun alignment coil 10b for alignment of the charged particle beam B from the image data stored in the frame memory 32a. The calculated values of excitation currents are output from the optimum value calculator 36 to the gun alignment coil driver amplifier 11.

The image displacement vector calculator 34 calculates image displacement vectors, each based on two images specified in the frame memory 32a. The optimum value calculator 36 calculates optimum values of the excitation currents through the gun alignment coils 10a and 10b from the image displacement vectors found by the image displacement vector calculator 34. The results of the calculation are given to the gun alignment coils 10a and 10b by the gun alignment coil driver amplifier 11.

1.2. Operation of the Charged Particle Beam System

The operation of the charged particle beam system 100 associated with the first embodiment is next described.

In the charged particle beam system 100 associated with the present embodiment, axial alignment of the charged particle beam is made using a filament image. The axial alignment made by the charged particle beam system associated with the present embodiment is an action for aligning the axis of the charged particle beam B with the central axis of the objective aperture 14.

Figure 2:
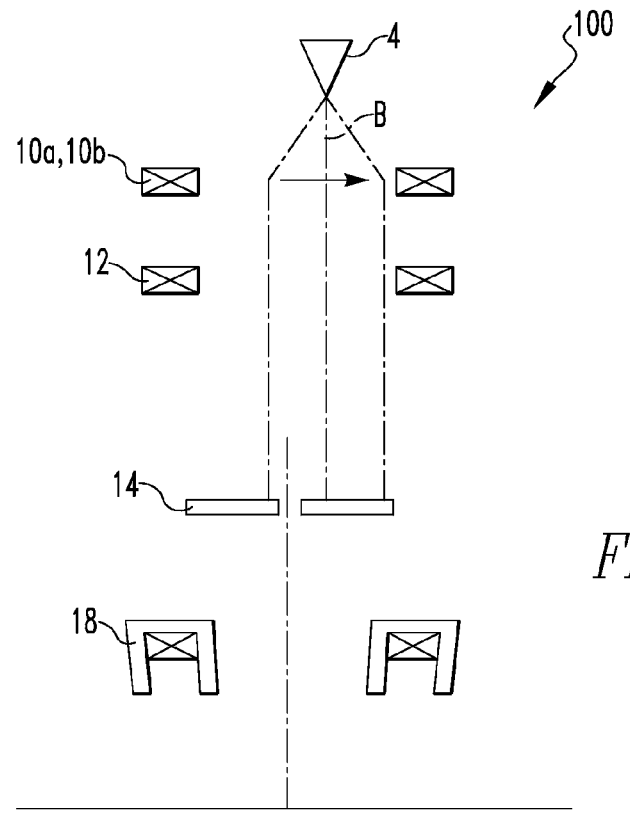
FIGS. 2 and 3 are ray diagrams illustrating a method of making axial alignment of a charged particle beam using a filament image.
Figure 3:
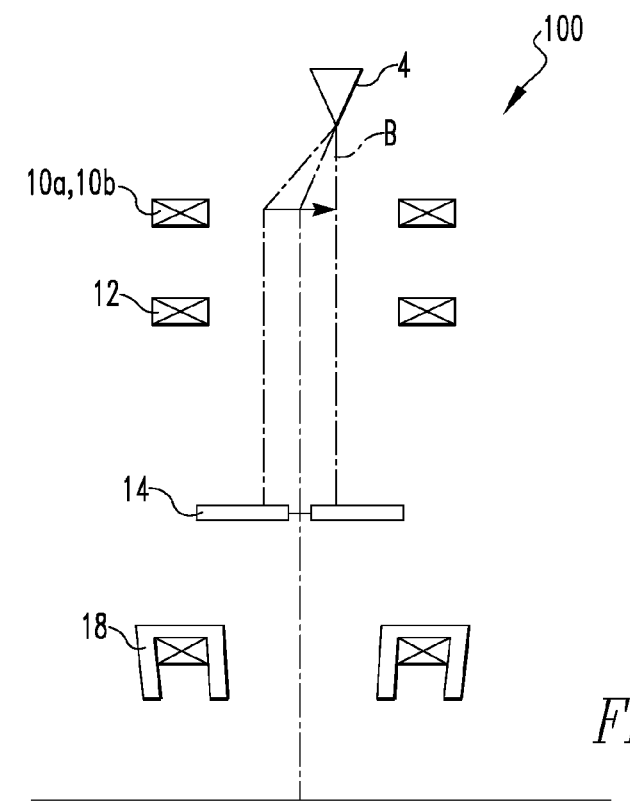
Figure 4:
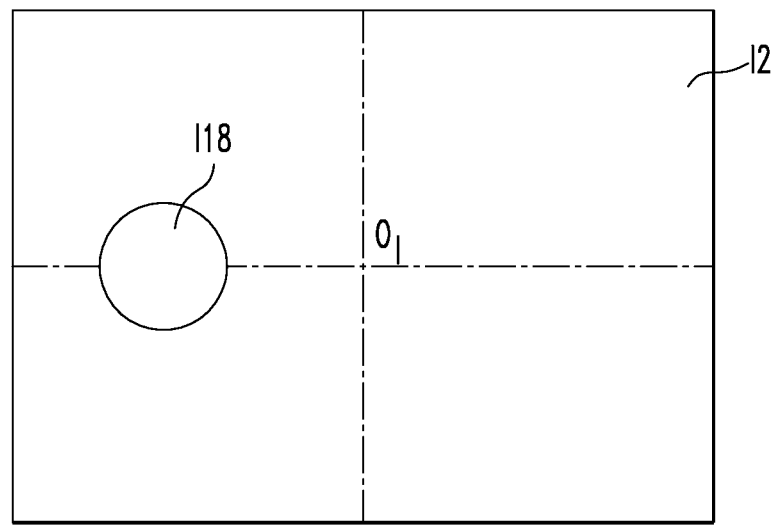
FIG. 4 is a schematic representation of a filament image obtained under the condition shown in FIG. 2.
Figure 5:
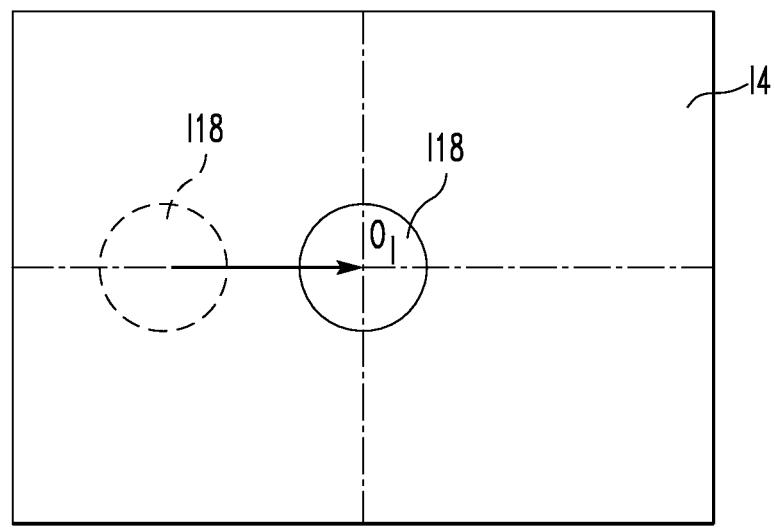
FIG. 5 is a schematic representation of a filament image obtained under the condition shown in FIG. 3.

FIGS. 2 and 3 illustrate a method of axial alignment of the charged particle beam using a filament image, and schematically depict the optics of the charged particle beam system 100. FIG. 4 schematically shows the filament image obtained under the condition shown in FIG. 2. FIG. 5 schematically shows the filament image obtained under the condition shown in FIG. 3. For the sake of convenience, components other than the beam source 4, gun alignment coils 10a, 10b, condenser lenses 12, objective aperture 14, and objective lens 18 are omitted in FIGS. 2 and 3.

As shown in FIG. 2, a filament image is created and displayed by scanning the charged particle beam B with the gun alignment coils 10a and 10b without using the scan coil 16 and detecting secondary signals produced by irradiation of the sample S with the beam B passed through the aperture hole in the objective aperture 14 as a signal by the detector 22. In the excitation currents through the gun alignment coils 10a and 10b, scan signal components are added to DC components corresponding to adjusted values calculated in the present embodiment. As a consequence, the gun alignment coils 10a and 10b can scan the beam B. In the charged particle beam system 100, the setting device 30 for setting shooting conditions for axial alignment supplies signals corresponding to the DC components of the excitation currents through the gun alignment coils 10a and 10b. The scan signal generator 17a supplies scan signals corresponding to the scan signal components of the excitation currents through the gun alignment coils 10a and 10b. Because of the scanning of the beam B by the gun alignment coils 10a and 10b, the axis of the incident light from the beam source 4 incident on the condenser lenses 12 and objective aperture 14 is swung. Consequently, as shown in FIG. 4, during the period in which the beam B is passing through the aperture (aperture hole) in the objective lens 18, an image I2 of high brightness is obtained from within the image frame. In this way, a part of the area scanned by the beam is shielded by the objective aperture 14 and a shielded region is formed. This gives rise to the image I2. The objective aperture 14 acts as a member for shielding a part of the area scanned by the beam B. During acquisition of the filament image, the sample S does not need to be positioned. In this case, secondary electrons emitted by irradiation of the sample stage 20 with the charged particle beam B may be detected.

The axis of the charged particle beam B is coincident with the center $O_I$ of the image obtained by scanning the beam B. Accordingly, where the axis of the beam and the central axis of the objective aperture 14 are not coincident as shown in FIG. 2, a point I18 at which the brightness is maximum in the image I2 deviates from the center $O_I$ of the image $I_2$ as shown in FIG. 4. The amount of deviation in the X-direction and the amount of deflection in the Y-direction may or may not be coincident.

FIG. 3 shows the state in which the axis of the charged particle beam has been aligned with the central axis of the objective aperture 14 by adjusting the DC components of the excitation currents through the gun alignment coils 10a and 10b. Under this condition, as shown in FIG. 5, the point I18 at which the brightness is maximum in the filament image is coincident with the center $O_I$ of an image I4. Therefore, the axis of the beam B can be aligned with the central axis of the objective aperture 14 by adjusting the DC components of the excitation currents through the gun alignment coils 10a and 10b such that the point I18 of maximum brightness in the filament image agrees with the center $O_I$ of the image. After the end of the adjustment, the scan signal components added to the excitation currents through the gun alignment coils 10a and 10b are eliminated, and only the adjusted DC components are left. Consequently, axial alignment of the beam B can be made. During capturing of the filament image, the excitation currents through the condenser lenses 12 and the objective lens 18, for example, are set under the same conditions as during normal sample observation. During capturing of the filament image, the scan coil 16 is not used.

Figures 6, 7:
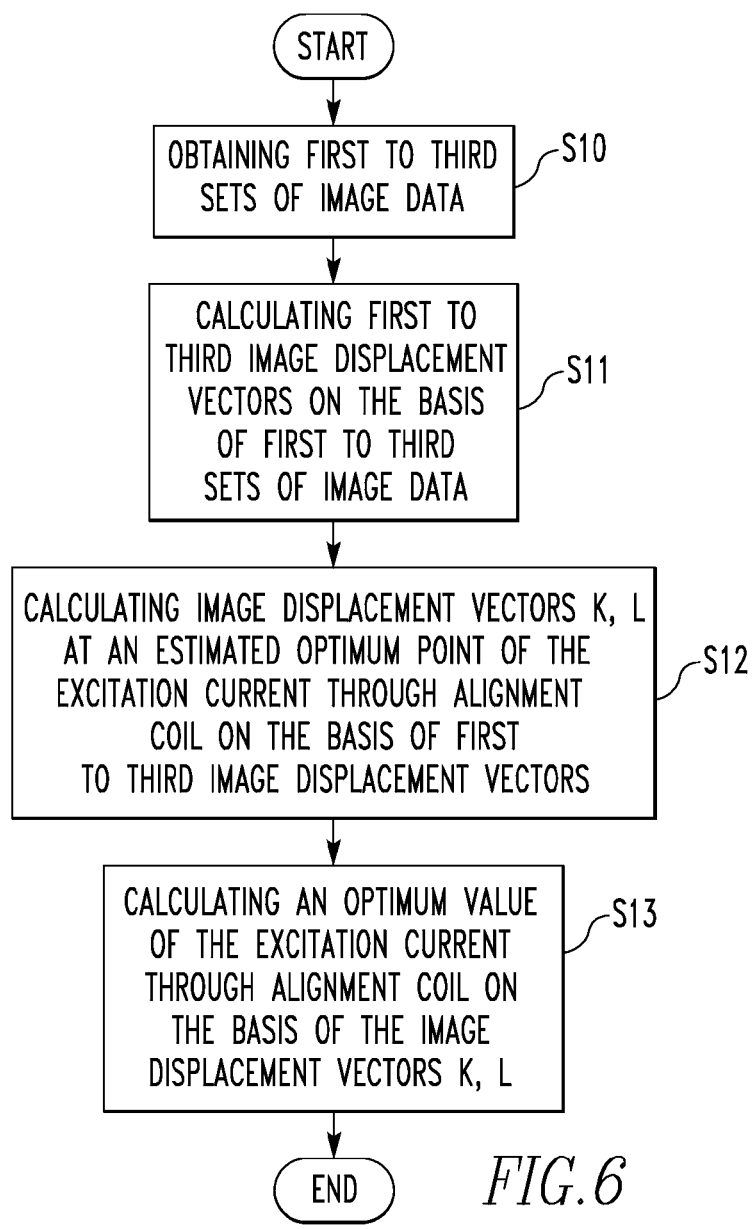
FIG. 6 is a flowchart illustrating a sequence of steps for making axial alignment of a charged particle beam by a method associated with the first embodiment.
FIG. 7 is a table illustrating shooting conditions under which frames 1-3 of images are taken.

FIG. 6 is a flowchart illustrating a sequence of operations for axial alignment made by the charged particle beam system 100 associated with the present embodiment.

First to third sets of image data are first obtained by the setting device 30 for setting shooting conditions for axial alignment (S10). The setting device 30 scans the charged particle beam such that a part of the area scanned with the beam B is blocked by the objective aperture 14 and thus a shielded region is formed. The setting device 30 repeats the scanning while varying conditions of the excitation currents through the X gun alignment coil 10a and Y gun alignment coil 10b, respectively. In this manner, frames 1-3 of image are taken, thus obtaining the first to third sets of image data. At this time, the gun alignment coil driver amplifier 11 generates the DC components of the excitation currents through the gun alignment coils 10a and 10b, respectively, based on the signals from the setting device 30, and generates the scan signal components of the excitation currents through the gun alignment coils 10a and 10b, respectively, based on the signals from the scan signal generator 17a. The generated components are added as the excitation currents for energizing the coils and supplied from the gun alignment coil driver amplifier 11 to the gun alignment coils 10a and 10b. The frames 1-3 are filament images. The frames 1-3 taken by the setting device 30 are stored as first to third sets of image data in the frame memory 32a. Also, the shooting conditions under which the frames 1-3 (indicated by the first to third sets of image data) were taken are stored in the memory 32.

FIG. 7 is a table indicating the shooting conditions under which frames are taken. As listed in FIG. 7, the shooting conditions for each frame is given by (value of excitation current (DC component) through the X gun alignment coil, value of excitation current (DC component) through the Y gun alignment coil). For the frame 1, the shooting conditions are (X=X0, Y=Y0). For the frame 2, the shooting conditions are (X=X0, Y=Y0+Δ2). For the frame 3, the shooting conditions are (X=X0+Δ1, Y=Y0). During capturing of each frame, the setting device 30 for setting shooting conditions for axial alignment adds scanning signal components to the values of the excitation currents through the gun alignment coils 10a and 10b provided in the table of FIG. 7. Furthermore, during capturing of each frame, the charged particle beam system 100 does not alter conditions other than the conditions of the values of the excitation currents (DC components) through the gun alignment coils 10a and 10b. That is, the shooting conditions (i.e., conditions of the area scanned with the charged particle beam and of the optics of the charged particle beam system) for the frames remain the same except for the values of the excitation currents (DC components) through the gun alignment coils 10a and 10b.

X0 (first current value) is the initial value of the DC component of the excitation current through the X gun alignment coil 10a at the beginning of an axial alignment operation. Y0 (second current value) is the initial value of the DC component of the excitation current through the Y gun alignment coil 10b at the beginning of the axial alignment operation. The initial values X0 and Y0 may or may not be equal to each other. Δ2 is a second incremental amount of current by which the DC component of the excitation current through the Y gun alignment coil 10b is varied. Δ1 is a first incremental amount of current by which the DC component of the excitation current through the X gun alignment coil 10a is varied. The incremental amounts Δ2 and Δ1 may or may not be identical to each other. In the present embodiment, under the condition where initial value X0=10 mA and initial value Y0=20 mA, it is assumed that Δ2=+10 mA and Δ1=−10 mA. No restrictions are imposed on the current values X0, Y0, Δ2, and Δ1. Rather, these current values can assume any desired values. The current values X0, Y0, Δ2, and Δ1 may be previously set in the setting device 30 for setting shooting conditions for axial alignment.

Where the initial value Y0 of the excitation current through the Y gun alignment coil 10b is positive, the incremental amount of current Δ2 of the excitation current through the Y gun alignment coil 10b may be a negative value. Where the initial value Y0 is negative, the incremental amount Δ2 may be a positive value. Similarly, where the initial value X0 of the excitation current through the X gun alignment coil 10a is positive, the incremental amount Δ1 of the excitation current through the X gun alignment coil 10a may be a negative value. Where the initial value X0 is negative, the incremental amount Δ1 may be a positive value. Optimum values of the excitation currents through the gun alignment coils 10a and 10b are, in essence, often close to values assumed when the excitation currents through the gun alignment coils 10a and 10b are zero. Consequently, the incremental amounts Δ2 and Δ1 for the gun alignment coils 10a and 10b can be previously brought close to the optimum values X3 and Y3 of the excitation currents through the gun alignment coils 10a and 10b as described later. Hence, the optimum values X3 and Y3 can be calculated with improved accuracy.

In the present step, the first set of image data is obtained under conditions where the value of the excitation current through the X gun alignment coil 10a is the initial value X0 and the value of the excitation current through the Y gun alignment coil 10b is the initial value Y0. Furthermore, the second set of image data is obtained under conditions where the value of the excitation current through the X gun alignment coil 10a is the initial value X0 and the value of the excitation current through the Y gun alignment coil 10b is a current value (X0+Δ2) obtained by varying the initial value X0 by the second incremental amount Δ2. In addition, the third set of image data is derived under conditions where the value of the excitation current through the X gun alignment coil 10a is a current value (X0+Δ1) obtained by varying the initial value X0 by the first incremental current value Δ1 and where the value of the excitation current through the Y gun alignment coil 10b is the initial value Y0. That is, the conditions under which the first set of image data is obtained and the conditions under which the second set of image data is obtained are identical in value of excitation current through the X gun alignment coil 10a and different in value of excitation current through the Y gun alignment coil 10b. The conditions under which the first set of image data is obtained and the conditions under which the third set of image data is obtained are different in value of excitation current through the X gun alignment coil 10a and identical in value of excitation current through the Y gun alignment coil 10b. The conditions under which the second set of image data is obtained and the conditions under which the third set of image data is obtained are different in value of excitation current through the X gun alignment coil 10a and in value of excitation current through the Y gun alignment coil 10b.

Then, the image displacement vector calculator 34 calculates a first image displacement vector A (a, b) indicative of the amount of positional deviation between a first image (frame 1) formed by the objective aperture 14 and indicated by a first set of image data and an inverted image of the first image obtained by rotating the first image through 180 degrees about the center of the image. Furthermore, the vector calculator 34 computes a second image displacement vector B (c, d) indicative of the amount of positional deviation between a second image (frame 2) formed by the objective aperture 14 and indicated by a second set of image data and an inverted image of the second image obtained by rotating the second image through 180 degrees about the center of the image. In addition, the vector calculator 34 calculates a third image displacement vector C (e, f) indicative of the amount of positional deviation between a third image (frame 3) formed by the objective aperture 14 and indicated by a third set of image data and an inverted image of the frame 3 obtained by rotating the third image through 180 degrees about the center of the image (S11).

Figure 8:
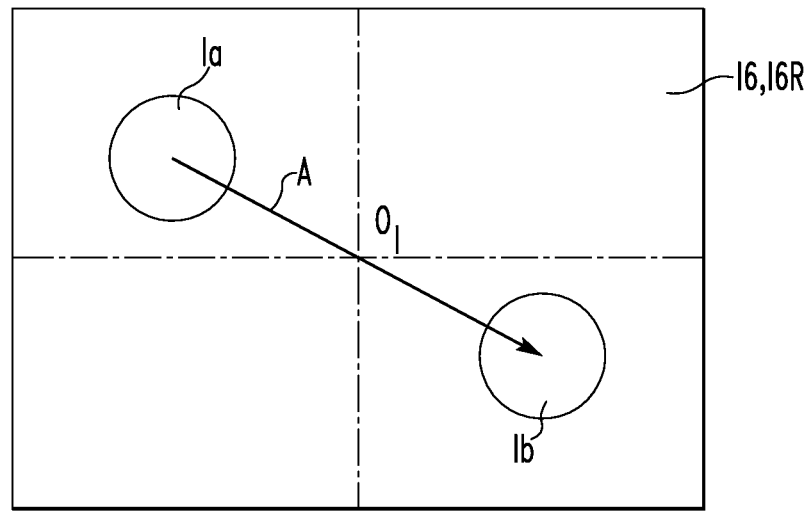
FIG. 8 is a diagram illustrating a first image displacement vector A.

An image displacement vector is a vector indicating the amount of positional deviation (direction and magnitude) between two frames of images. FIG. 8 illustrates the first image displacement vector A. In FIG. 8, a frame 1 indicated by 16 and an inverted image I6R of the frame 1 are shown to be superimposed. An inverted image is obtained by rotating a given image through 180 degrees about an image center $O_I$. As shown in FIG. 8, an image Ia corresponding to the objective aperture 14 is obtained in the frame 1 (I6). Similarly, an image Ib corresponding to the objective aperture 14 is obtained in the image I6R. An image corresponding to the objective aperture 14 is formed by shielding a part of the area scanned by the charged particle beam B with the objective aperture 14 to thereby form a shielded region. The image displacement vector A interconnects the image Ia corresponding to the objective aperture 14 in the frame 1 (I6) and the image Ib (inverted image I6R of the frame 1) corresponding to the objective aperture 14. That is, the vector A indicates the amount of positional deviation between the frame 1 formed by the objective aperture 14 and an inverted image of the frame 1. Similarly, the image displacement vector B indicates the amount of positional deviation between the frame 2 of image formed by the objective aperture 14 and an inverted image of the frame 2. Similarly, the image displacement vector C indicates the amount of positional deviation between the frame 3 of image formed by the objective aperture 14 and an inverted image of frame 3.

An image displacement vector can be calculated, for example, by calculating a cross-correlation between two frames of images. In this case, the calculation of the cross-correlation is carried out by performing an inverse Fourier transform of the product of the complex conjugates of two-dimensional Fourier transforms of the two images. The coordinates of a maximum value of the results of the computation of the two-dimensional cross-correlation indicate an image displacement vector.

Alternatively, an image displacement vector may also be obtained by calculating a vector interconnecting the points of maximum brightness of two images and taking the calculated vector as an image displacement vector. Instead of points of maximum brightness, the middle point of two dark/bright boundary points along the X-direction of a filament image and the middle point of two dark/bright boundary points along the Y-direction may be used.

Figure 9:
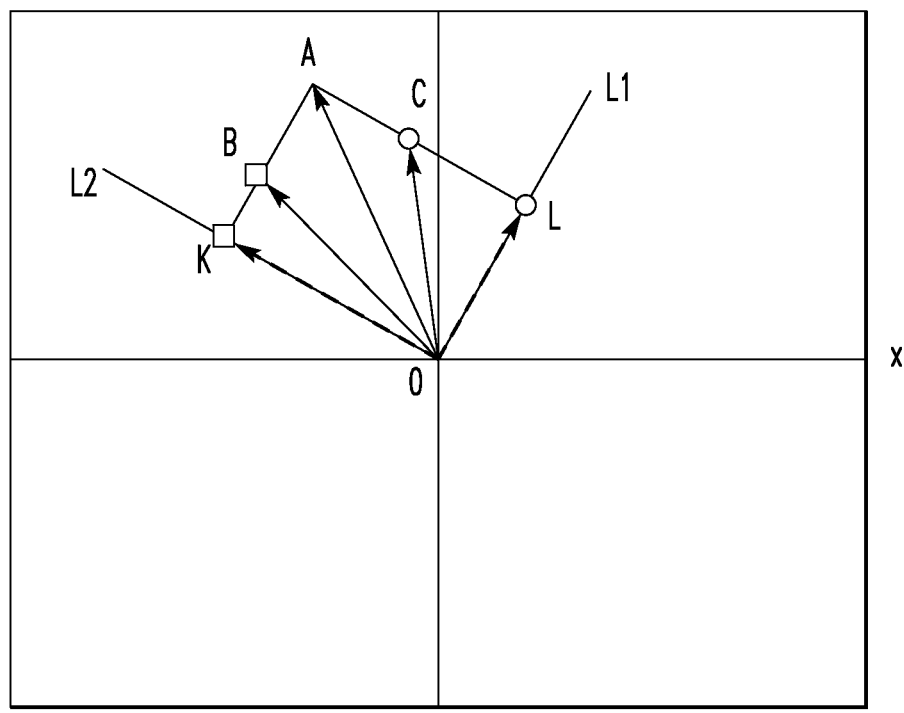
FIG. 9 is a diagram illustrating the relationships among image displacement vectors A, B, and C.

FIG. 9 shows the relationship among the image displacement vectors A, B, and C. The horizontal axis x indicates x-components in an image displacement vector coordinate system. The vertical axis y indicates y-components in the image displacement vector coordinate system.

Referring to FIG. 9, the optimum value calculator 36 calculates an image displacement vector L (s, t) at an estimated optimum point of the excitation current through the X gun alignment coil 10a and an image displacement vector K (g, h) at an estimated optimum point of the excitation current through the Y gun alignment coil 10b (SI2).

A state in which the point of maximum brightness in a filament image is coincident with the center of an image within a frame of image is equivalent to a state in which an image displacement vector is equal to 0. Accordingly, the values of currents through the gun alignment coils 10a and 10b assumed at the origin of FIG. 9 are optimum values through the gun alignment coils 10a and 10b. In the present embodiment, calculation of the values of the currents through the gun alignment coils 10a and 10b at the origin of FIG. 9 is replaced by calculation of the values of currents at the image displacement vectors L and K. That is, at the point L, the excitation current through the X gun alignment coil 10a is an optimum value. At the point K, the excitation current through the Y gun alignment coil 10b is an optimum value.

In particular, an estimated optimum point of the excitation current through the X gun alignment coil 10a is a coordinate point on an image displacement vector at which the value of the excitation current through the X gun alignment coil 10a is the optimum value X3, i.e., the value of the excitation current through the X gun alignment coil when the axis of the charged particle beam taken in the X-direction is aligned. An estimated optimum point of the excitation current through the Y gun alignment coil 10b is a coordinate point on an image displacement vector at which the value of the excitation current through the Y gun alignment coil 10b is the optimum value Y3, i.e., the value of the excitation current through the Y gun alignment coil when the axis of the charged particle beam taken in the Y-direction is aligned.

As shown in FIG. 9, a straight line AC meets at the point L (s, t) with a straight line L1 that is parallel to the straight line AB and passes through the origin. Similarly, the straight line AB meets at the point K (g, h) with a straight line L2 that is parallel to the straight line AC and passes through the origin.

The image displacement vectors K (g, h) and L (s, t) are calculated, for example, from the following Eqs. (1)-(4).

$$g = \frac{(b \times c - a \times d) \times (a - e)}{(b - d) \times (a - e) - (a - c) \times (b - f)} \quad (1)$$

$$h = \frac{(b \times c - a \times d) \times (b - f)}{(b - d) \times (a - e) - (a - c) \times (b - f)} \quad (2)$$

$$s = \frac{(b \times e - a \times f) \times (a - c)}{(b - f) \times (a - c) - (a - e) \times (b - d)} \quad (3)$$

$$t = \frac{(b \times e - a \times f) \times (b - d)}{(b - f) \times (a - c) - (a - e) \times (b - d)} \quad (4)$$

Then, the optimum value calculator 36 computes the value of the excitation current (optimum value X3) through the X gun alignment coils 10a at the vector L from the values of the excitation current through the X gun alignment coil 10a at the vectors A and C (S13).

Figure 10:
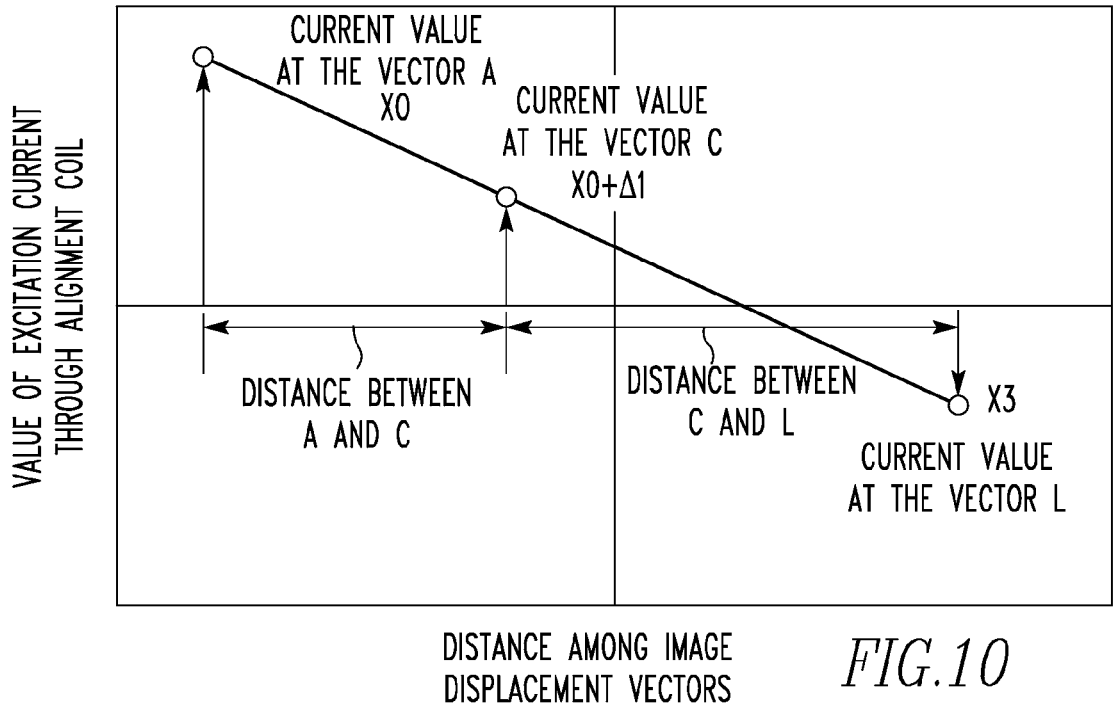
FIG. 10 is a diagram illustrating the relationships of the distances among vectors A, C, and L to the value of the excitation current through an X alignment coil.

FIG. 10 is a diagram illustrating the relationship of the distances among the vectors A, C, and L to the value of the excitation current through the X gun alignment coil 10a. As shown in FIG. 10, the optimum value X3 of the excitation current through the X gun alignment coil 10a is computed from both the excitation current value X0 at the vector A and the value of excitation current X0+Δ1 at the vector C. The optimum value calculator 36 performs calculations, for example, using the values of excitation currents X0 and (X0+Δ1) at the vectors A and C stored in the memory 32. The optimum value X3 of the excitation current through the X gun alignment coil 10a is calculated, for example, from the following Eqs. (5) and (6). Eq. (5) is used when the coordinate point A of the vector A shown in FIG. 10 lies between the coordinate point C of the vector C and the coordinate point L of the vector L. Eq. (6) is used when the coordinate point A of the vector A does not lie between the coordinate point C of the vector C and the coordinate point L of the vector L $$X3 = \frac{(XA - XC) \times \sqrt{(s-a)^2 + (t-b)^2}}{\sqrt{(e-a)^2 + (f-b)^2}} + XA \quad (5)$$

$$X3 = \frac{-(XA - XC) \times \sqrt{(s-a)^2 + (t-b)^2}}{\sqrt{(e-a)^2 + (f-b)^2}} + XA \quad (6)$$

where XA is the excitation current value X0 at the vector A and XC is the excitation current value (X0+Δ1) at the vector C.

Figure 11:
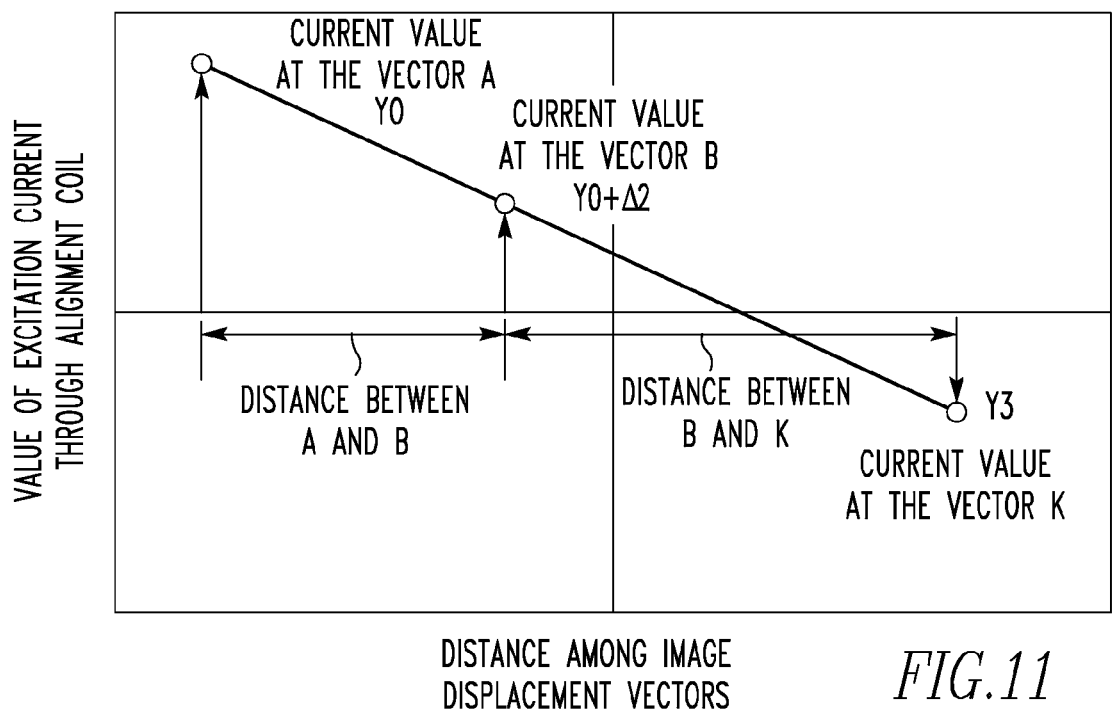
FIG. 11 is a diagram illustrating the relationships of the distances among vectors A, B, and K to the values of the excitation current through a Y alignment coil.

FIG. 11 shows the relationships of the distances among the vectors A, B, K to the value of the excitation current through the Y gun alignment coil 10b. The optimum value calculator 36 computes the optimum value Y3 of the excitation current through the Y gun alignment coil 10b from both the excitation current value Y0 at the vector A and the excitation current value (Y0+Δ2) at the vector B as shown in FIG. 11 (S13). For instance, the optimum value Y3 of the excitation current through the Y gun alignment coil 10b is calculated from the following Eqs. (7) and (8). Eq. (7) is used when the coordinate point A of the vector A is located between the coordinate point B of the vector B and the coordinate point K of the vector K. Eq. (8) is used when the coordinate point A of the vector A is not located between the coordinate point B of the vector B and the coordinate point K of the vector K $$Y3 = \frac{(YA - YB) \times \sqrt{(g-a)^2 + (h-b)^2}}{\sqrt{(c-a)^2 + (d-b)^2}} + YA \quad (7)$$

$$Y3 = \frac{-(YA - YB) \times \sqrt{(g-a)^2 + (h-b)^2}}{\sqrt{(c-a)^2 + (d-b)^2}} + YA \quad (8)$$

where YA is the excitation current value Y0 at the vector A and YB is the excitation current value Y0+Δ2 at the vector B.

Because of the steps described so far, the optimum value X3 of the excitation current through the X gun alignment coil 10a and the optimum value Y3 of the excitation current through the Y gun alignment coil 10b can be computed. In the above Eqs. (1)-(8), variables are only the image displacement vector components computed from obtained images and set values of currents through the gun alignment coils 10a and 10b. That is, parameters intrinsic to the electron optical system are not contained in the above Eqs. (1)-(8). Therefore, it is easy to make axial alignment of the charged particle beam.

The optimum value calculator 36 then generates control signals based on the calculated optimum values X3 and Y3 of the excitation currents through the gun alignment coils 10a and 10b, outputs the control signals to the gun alignment coil driver amplifier 11, and provides control such that the excitation currents through the X gun alignment coil 10a and the Y gun alignment coil 10b are the optimum values X3 and Y3, respectively.

Because of the steps described so far, it is possible to make axial alignment of the charged particle beam B.

In the present embodiment, the optimum values X3 and Y3 of the excitation currents through the gun alignment coils 10a and 10b can be found from the 3 sets of image data (frames 1-3) as described previously. According to the present embodiment, only a limited number of sets of image data are required to be obtained in order to axially align the charged particle beam in this way. Therefore, it is easy to align the beam axially. Accordingly, the burden on the operator of the system is reduced. The time taken to make axial alignment of the beam can be shortened.

The charged particle beam system associated with the present embodiment has the setting device 30 for setting shooting conditions for axial alignment, the setting device operating to scan the charged particle beam B such that a part of an area scanned with the beam B is shielded and thus a shielded region is formed. The scanning is repeated while varying conditions of the excitation currents through the X gun alignment coil 10a and the Y gun alignment coil 10b, respectively, thus obtaining first to third sets of image data. The system also has the image displacement vector calculator 34 for calculating the first image displacement vector based on both a first image indicated by the first set of image data and an inverted image of the first image, calculating the second image displacement vector based on both a second image indicated by the second set of image data and on an inverted image of the second image, and the third image displacement vector based on a third image indicated by the third set of image data and an inverted image of the third image. Furthermore, the system has the optimum value calculator 36 for calculating the values of the excitation currents X3 and Y3 through the gun alignment coils 10a and 10b for axial alignment of the beam based on the first to third image displacement vectors. Consequently, the charged particle beam can be easily aligned axially. Furthermore, axial alignment of the charged particle beam B can be automated easily.

1.3. Modifications

Modifications of the method of making axial alignment of a charged particle beam in the charged particle beam system associated with the present embodiment are next described.

1.3.1 First Modification

A first modification is first described.

In the above-described first embodiment, the image displacement vector calculator 34 calculates the image displacement vectors A, B, and C based on the frames of images 1-3 indicated by obtained image data and on inverted images of these frames of images 1-3 (S11).

In contrast, in this modification, the image displacement vector calculator 34 can obtain image displacement vectors A, B, and C by the use of a template image having a point of maximum brightness at an image center by calculating vectors connecting the point of maximum brightness in the template image with points of maximum brightness in the frames of images 1-3 corresponding to the objective aperture 14. For example, the template image is previously stored in the memory 32 by taking an image of a filament while the axis of the charged particle beam is aligned and obtaining image data about a frame of image having a point of maximum brightness at the center of the image. The template image is not restricted to the case where there is a point of maximum brightness at the image center. The requirement is that there is a point of maximum brightness in a given point within a frame.

The subsequent steps S12-S13 are the same as their counterparts of the first embodiment and so their description is omitted.

The image displacement vector calculator 34 may also find the first image displacement vector A without using a template image, for example, by finding the image center of frame 1 (first image) from a first set of image data and calculating a vector as the vector A, the vector connecting a point of maximum brightness in the first image with the found image center of the frame 1. The vector calculator 34 may compute the image displacement vectors B and C in the same way as for the image displacement vector A.

This modification facilitates making axial alignment of the charged particle beam in the same way as in the above-described first embodiment.

1.3.2 Second Modification

Figure 12:
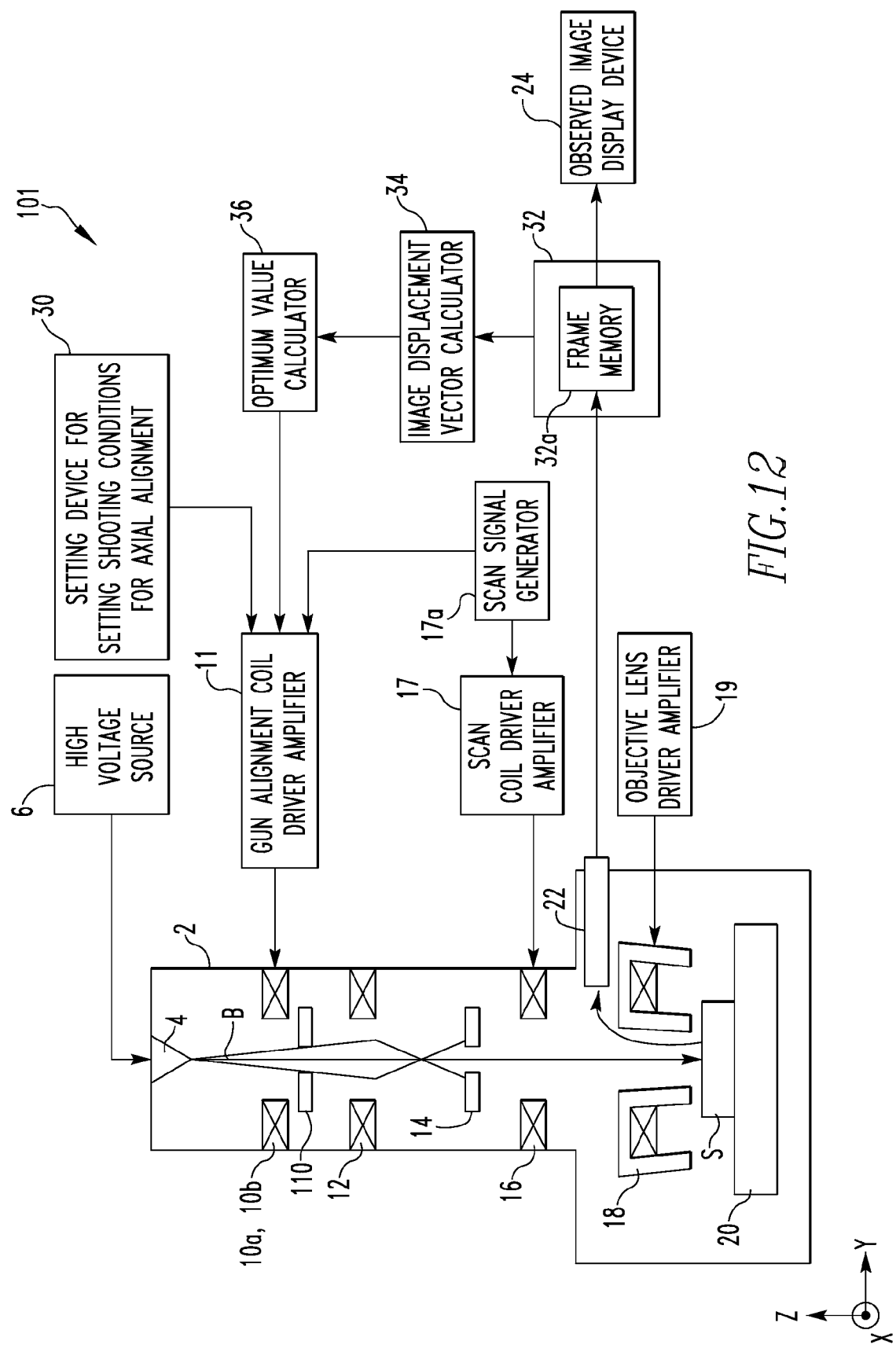
FIG. 12 is a block diagram of a charged particle beam system associated with a second modification of the first embodiment, showing the configuration of the system.

A second modification is next described. FIG. 12 shows the configuration of a charged particle beam system 101 associated with the second modification. Those components of the charged particle beam system 101 which are identical in function with their counterparts of the above-described charged particle beam system 100 are hereinafter indicated by the same reference numerals as in the previously referenced figures and their detailed description is omitted.

In the charged particle beam system 100 associated with the above-described first embodiment, the charged particle beam B is axially aligned by aligning the axis of the beam B with the central axis of the objective aperture 14.

In contrast, the charged particle beam system 101 is configured including a charged particle beam detection aperture 110 in addition to the components of the charged particle beam system 100. The system 101 makes axial alignment of the beam B by aligning the axis of the beam B with the central axis of the detection aperture 110. That is, the detection aperture 110 acts as a shielding member that shields a part of the area scanned with the beam B to thereby form a shielded region.

The charged particle beam detection aperture 110 is disposed at a downstream-side from the gun alignment coils 10a and 10b. In the illustrated example, the detection aperture 110 is positioned between the gun alignment coil set consisting of the gun alignment coils 10a and 10b and the condenser lenses 12. The detection aperture 110 is used to detect variations in the charged particle beam B, and is located in the path of the beam B. The detection aperture 110 has an aperture hole (aperture) permitting passage of a part of the beam B. The central axis (optical axis) of the detection aperture 110 passes through the center of this aperture hole.

The charged particle beam system 101 is similar in operation to the charged particle beam system 100 except that the charged particle beam detection aperture 110 is used instead of the objective aperture 14 and so a description of the operation of the system 101 is omitted.

The shielding member that shields a part of the area scanned with the charged particle beam B may be made of other optical member constituting the charged particle beam system. Furthermore, the beam B may be axially aligned by scanning plural optical members and using images in which the optical member is detected. For example, a part of the area scanned with the charged particle beam is shielded by the charged particle beam detection aperture 110 and the objective aperture 14 so as to form a shielded region and axially aligning the beam B using images including an image formed by the shielded region.

2. Second Embodiment 2.1. Configuration of Charged Particle Beam System

Figure 13:
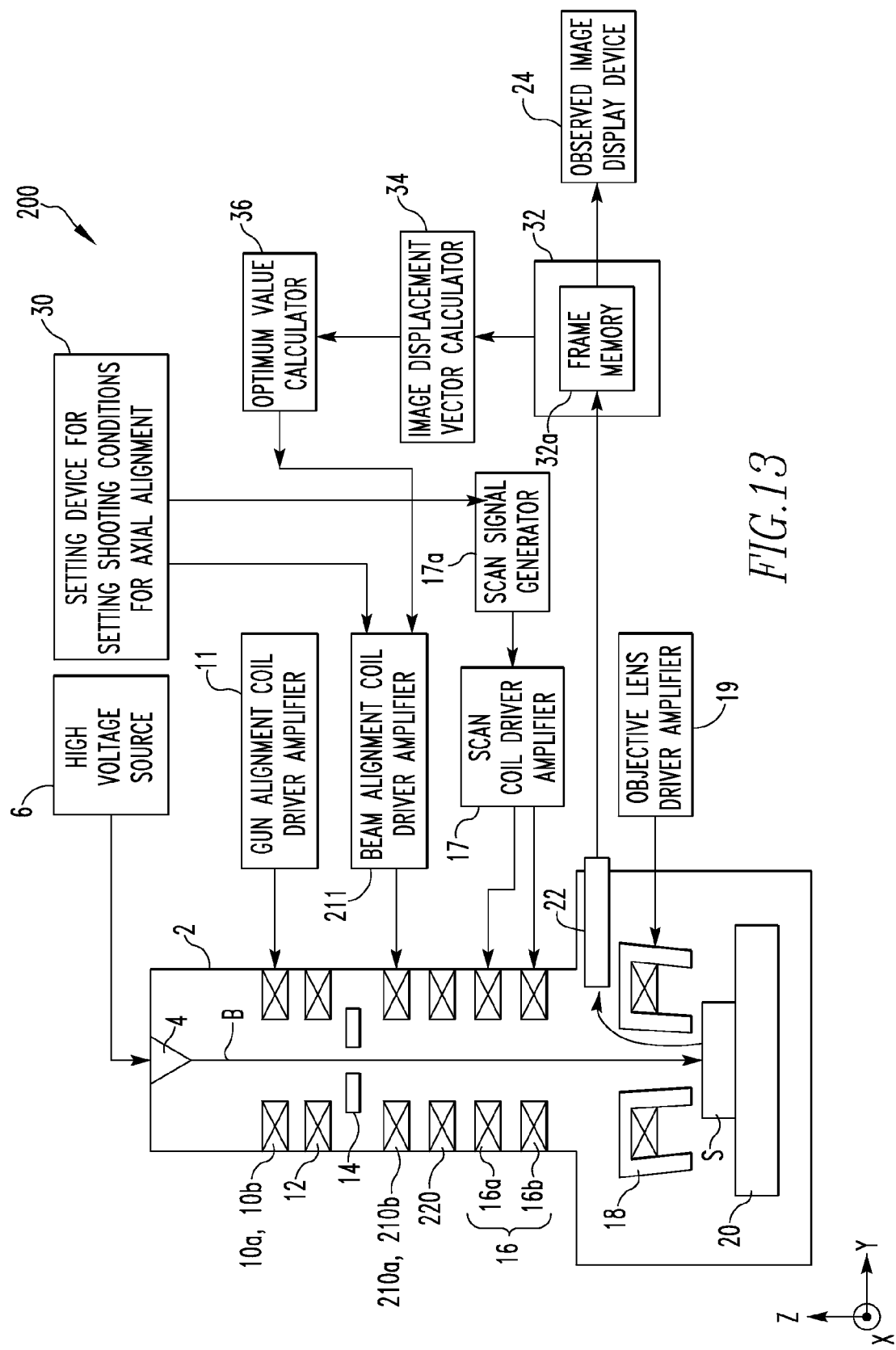
FIG. 13 is a block diagram of a charged particle beam system associated with a second embodiment of the invention, showing the configuration of the system.

The configuration of a charged particle beam system associated with a second embodiment is next described. FIG. 13 shows the configuration of the system, indicated by reference numeral 200. Those components of the charged particle beam system 200 which are functionally similar to their counterparts of the charged particle beam system 100 described already are hereinafter indicated by the same reference numerals as in the previously referenced figures and their detailed description is omitted.

In the above example of charged particle beam system 100, the charged particle beam B is axially aligned by aligning the axis of the beam B with the central axis of the objective aperture 14 using the gun alignment coils 10a and 10b.

In contrast, in the charged particle beam system 200, the charged particle beam B is axially aligned by aligning the axis of the beam B passed through the objective aperture 14 with the optical axis of the objective lens 18 using beam alignment coils 210a and 210b. More specifically, in the system 200, the beam B is axially aligned by correcting the deviation between the axis of the beam B and the optical axis of the objective lens 18 by the beam alignment coils 210a and 210b, the deviation being caused by a deviation between the central axis of the objective aperture 14 and the optical axis of the objective lens 18.

That is, in the first embodiment, the charged particle beam B is axially aligned at an upstream-side from the objective aperture 14 using the gun alignment coils 10a and 10b. In contrast, in the second embodiment, the charged particle beam is axially aligned at a downstream-side from the objective aperture 14 by the use of the beam alignment coils 210a and 210b. For instance, the charged particle beam may be axially aligned at a downstream-side from the objective aperture 14 by finding optimum values of excitation currents through the gun alignment coils 10a and 10b by the method associated with the first embodiment of axially aligning the charged particle beam B, then axially aligning the beam B at an upstream-side from the objective aperture 14, and finding optimum values of the excitation currents through the beam alignment coils 210a and 210b by the beam aligning method associated with the present embodiment.

The charged particle beam system 200 is configured including beam alignment coils 210a and 210b (which are examples of alignment coil), a beam alignment coil driver amplifier 211, and an aperture angle control lens 220, in addition to the components of the charged particle beam system 100.

The beam alignment coils 210a and 210b are located at a downstream-side from the objective aperture 14. In the illustrated example, the beam alignment coils 210a and 210b are positioned between the objective aperture 14 and the aperture angle control lens 220.

The charged particle beam B can be axially aligned using the X beam alignment coil 210a and the Y beam alignment coil 210b. The X beam alignment coil 210a has coil elements of one set which are opposite to each other along the X-direction, and can deflect the beam B in the X-direction (first direction). The Y beam alignment coil 210b has coil elements of one set which are opposite to each other along the Y-direction (second direction) intersecting with (perpendicular to) the X-direction, and can deflect the beam B in the Y-direction. That is, the beam B can be deflected in two dimensions by the X beam alignment coil 210a and the Y beam alignment coil 210b. Excitation currents through the beam alignment coils 210a and 210b are supplied from the beam alignment coil driver amplifier 211. The deflection of the beam B within the charged particle beam optics column 2 can be controlled in two dimensions by controlling the amounts of excitation currents flowing through the beam alignment coils 210a and 210b.

The aperture angle control lens 220 is located at a downstream-side from the beam alignment coils 210a and 210b. In the illustrated example, the aperture angle control lens 220 is disposed between the set of the beam alignment coils 210a and 210b and the scan coil 16. The correcting lens 220 can correct the angular aperture of the charged particle beam B.

The scan coil 16 has a first scan coil element 16a disposed near the charged particle beam source 4 and a second scan coil element 16b disposed near the sample S. The first scan coil element 16a can scan the beam B in the first scan direction. The second scan coil element 16b can scan the beam B in a second scan direction opposite to the first scan direction. Each of the scan coil elements 16a and 16b is configured, for example, including two coil sub-elements for varying the sense of the beam B in different directions. The axis of the beam B is coincident with the center of an image obtained by scanning the beam B.

The setting device 30 for setting shooting conditions for axial alignment can obtain image data while varying conditions of the excitation currents through the beam alignment coils 210a and 210b and conditions of the scan coil 16a and 16b for scanning the charged particle beam B. Furthermore, the setting device 30 can take plural images while varying the shooting conditions by controlling the excitation currents through the beam alignment coils 210a and 210b and controlling the operation of the scan coil 16a and 16b and store image data and shooting conditions in the memory 32. The setting device 30 is connected with the beam alignment coil driver amplifier 211, and controls the excitation currents through the beam alignment coils 210a and 210b via the driver amplifier 211. Further, the setting device 30 is connected with the scan signal generator 17a, and selects and controls the first scan coil 16a or second scan coil 16b via both scan signal generator 17a and scan coil driver amplifier 17.

The image displacement vector calculator 34 and optimum value calculator 36 calculate the values of excitation currents through the X beam alignment coil 210a and Y beam alignment coil 210b, respectively, for aligning the axis of the charged particle beam B from image data stored in the frame memory 32a. The calculated values of the excitation currents are output to the beam alignment coil driver amplifier 211 from the optimum value calculator 36.

The image displacement vector calculator 34 calculates image displacement vectors, each based on two specified images in the frame memory 32a. The optimum value calculator 36 computes optimum values of the excitation currents through the beam alignment coils 210a and 210b from the image displacement vectors found by the image displacement vector calculator 34. The results of the computation are given to the beam alignment coils 210a and 210b by the beam alignment coil driver amplifier 211.

2.2. Operation of Charged Particle Beam System

Figure 14:
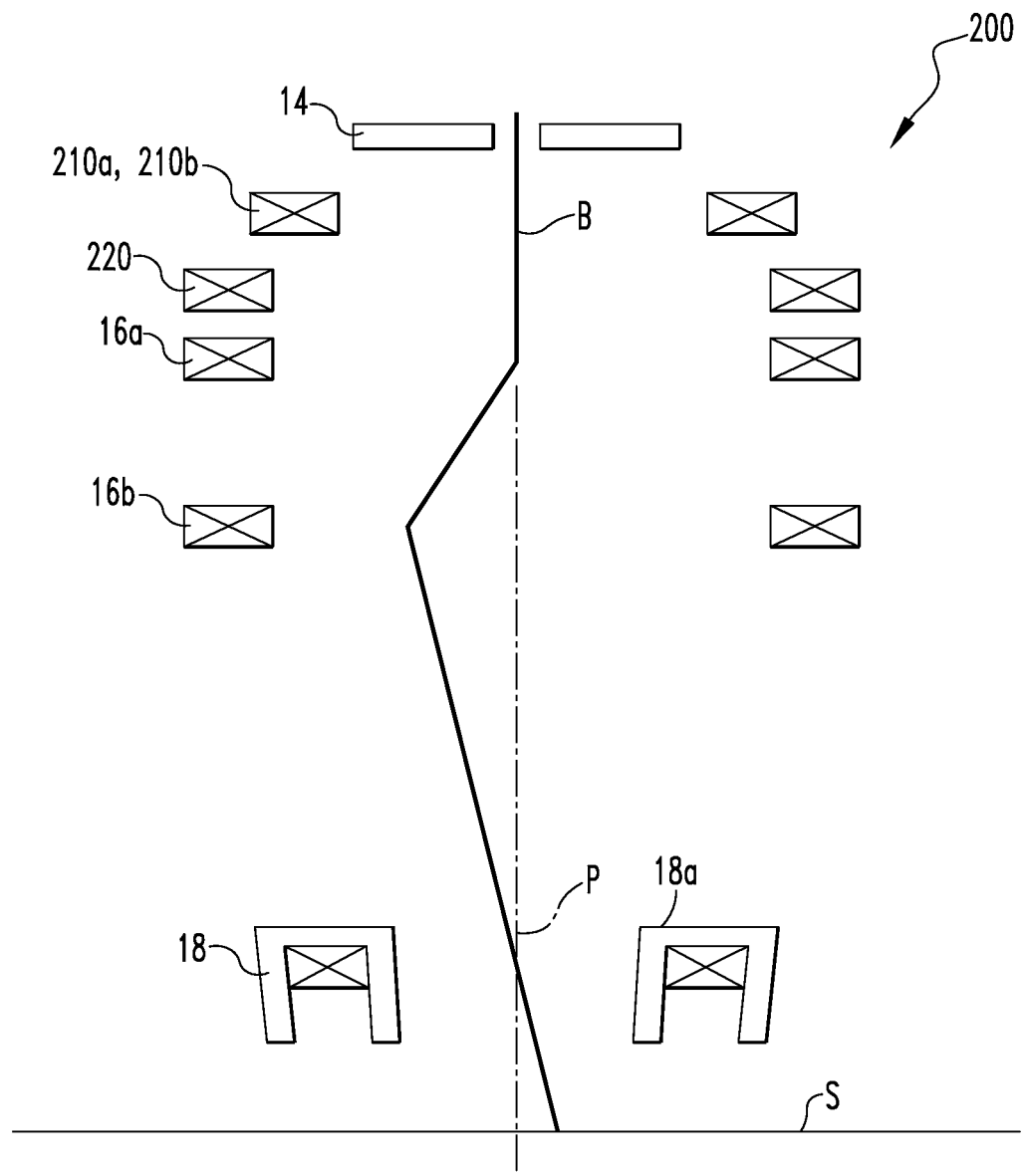
FIG. 14 is a diagram illustrating a method of making axial alignment of a charged particle beam in accordance with the second embodiment.
Figure 15A:
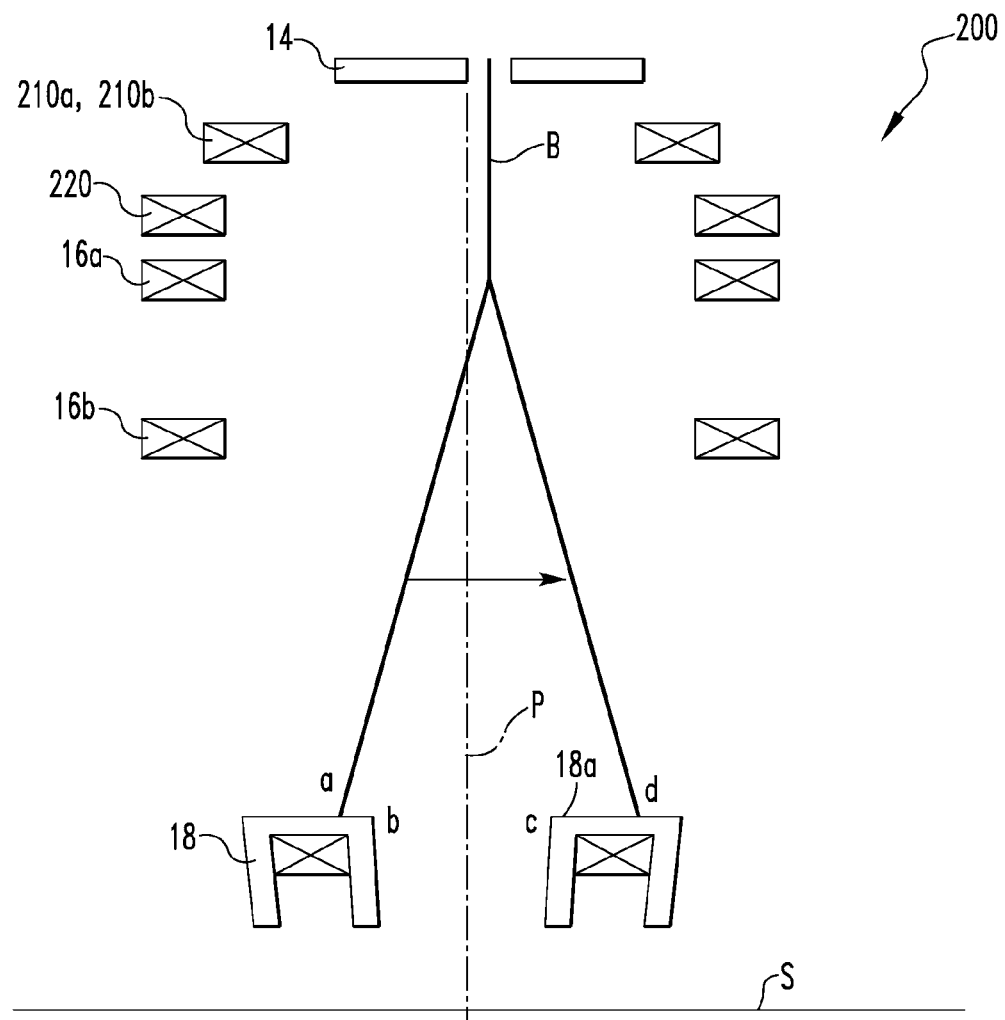
FIGS. 15A and 15B are diagrams illustrating a method of making axial alignment of a charged particle beam in accordance with the second embodiment.
Figure 15B:
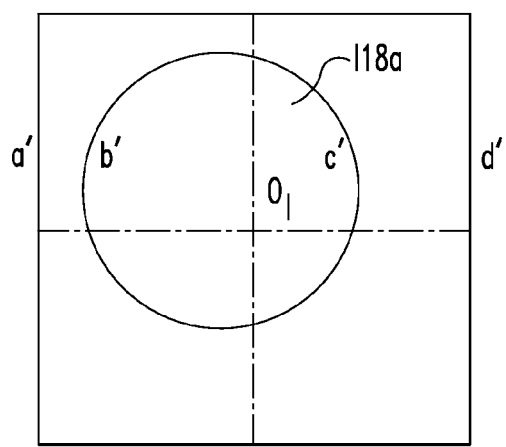
Figure 16A:
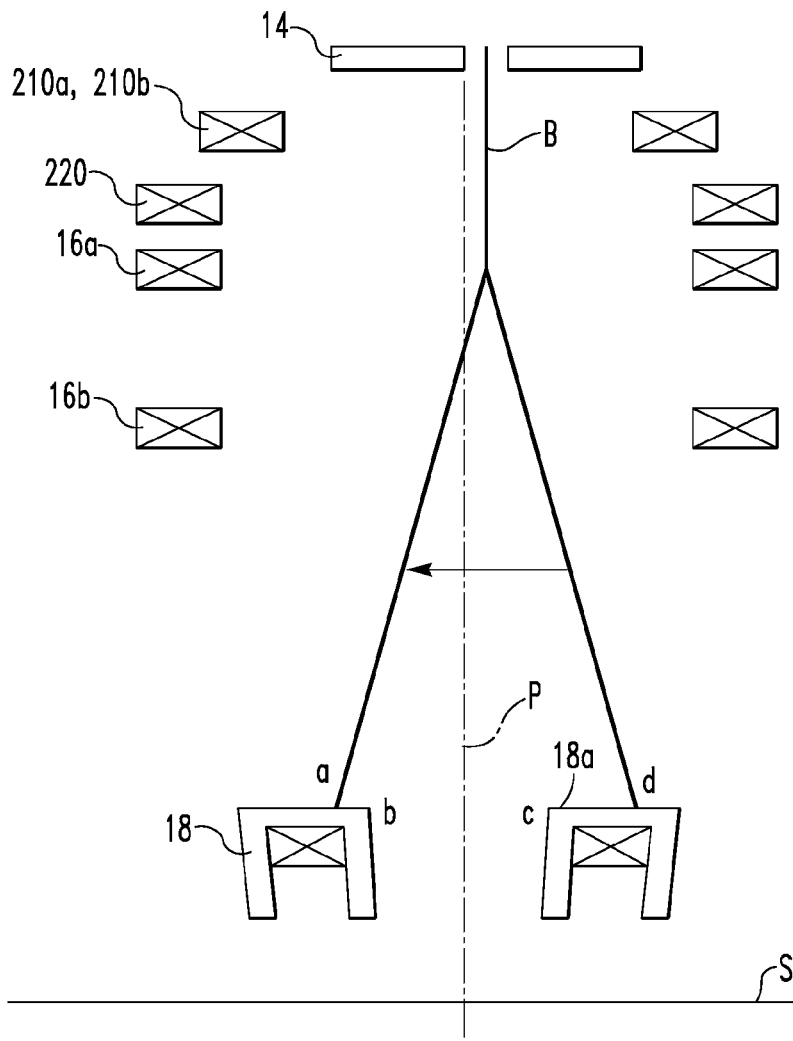
FIGS. 16A and 16B are diagrams illustrating a method of making axial alignment of a charged particle beam in accordance with the second embodiment.
Figure 16B:
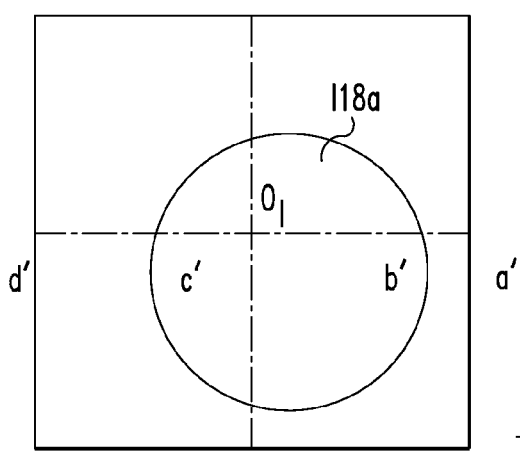
Figure 17A:
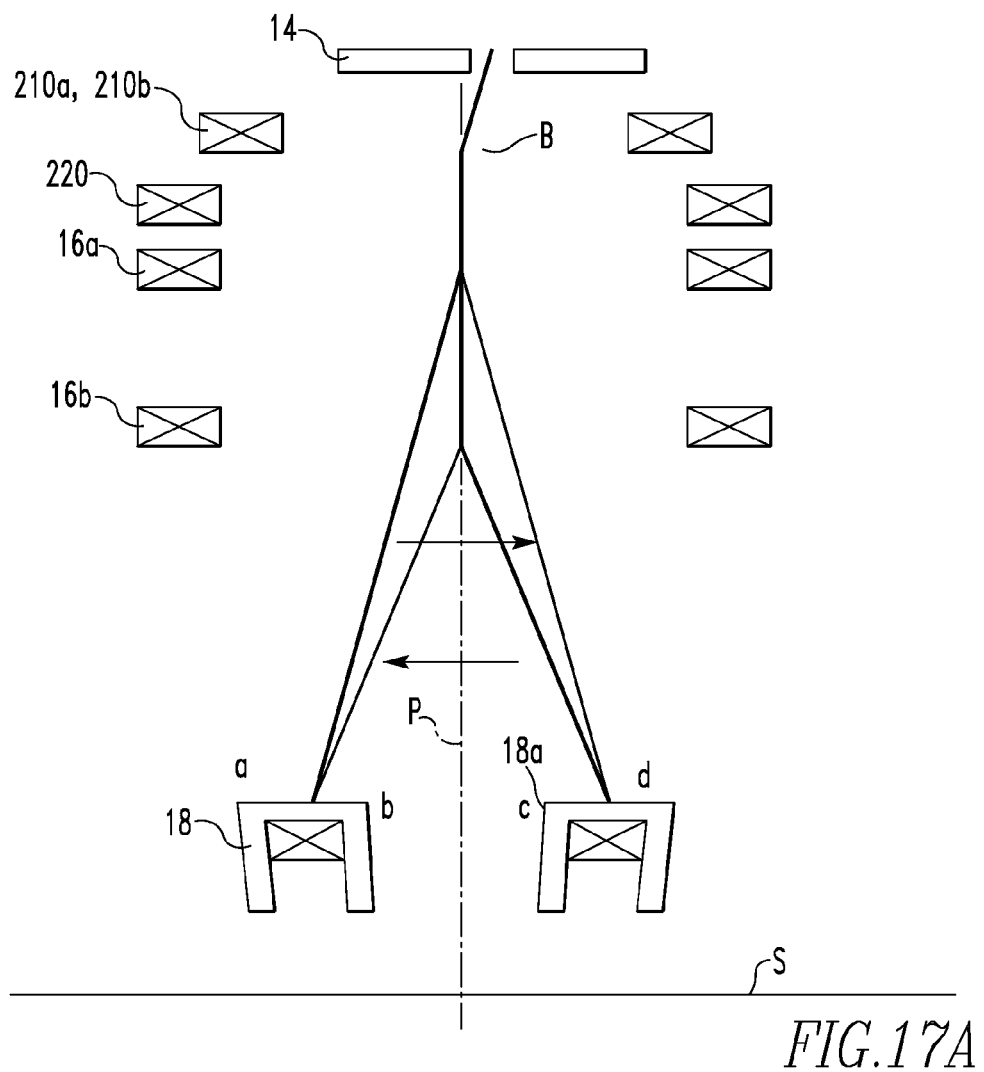
FIGS. 17A and 17B are diagrams illustrating a method of making axial alignment of a charged particle beam in accordance with the second embodiment.
Figure 17B:
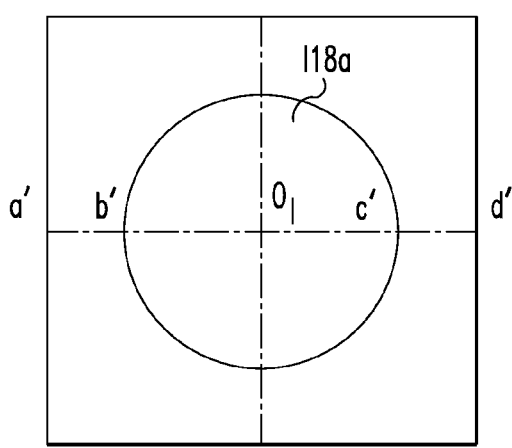

The operation of the charged particle beam system 200 associated with the second embodiment is next described. FIGS. 14-17 illustrate the principle of the method of making axial alignment of the charged particle beam B in the beam system 200. FIG. 14 shows the state in which the axis of the beam B passed through the objective aperture 14 is in alignment with the optical axis (central axis) P of the objective lens 18. FIG. 15A schematically shows the state in which the beam B is scanned with the first scan coil 16a while the axis of the beam B passed through the objective aperture 14 is not aligned with the optical axis P of the objective lens 18. FIG. 15B schematically shows an image obtained under the condition of FIG. 15A. FIG. 16A schematically shows the state in which the beam B is scanned with the second scan coil 16b while the axis of the beam B passed through the objective aperture 14 is not aligned with the optical axis P of the objective lens 18. FIG. 16B schematically shows an image obtained under the state of FIG. 16A. FIG. 17A schematically shows the state in which scanning is made with the first scan coil 16a or second scan coil 16b while the axis of the beam B passed through the objective aperture 14 is in alignment with the optical axis of the objective lens 18. FIG. 17B schematically shows an image obtained under the condition of FIG. 17A. In FIGS. 15A-17B, the same area is scanned with the beam B.

As shown in FIG. 14, in the charge particle beam system 200, the charge particle beam B passed through the objective aperture 14 is deflected by the first scan coil 16a and the second scan coil 16b and scanned over the sample S. The beam B is focused onto the sample S by the objective lens 18. Use of the two stages of scan coils 16a and 16b permits the beam B to pass through optical axis P of the objective lens 18 over the principal point of the objective lens 18 even if the beam B is scanned. As shown in FIG. 14, the direction of deflection made by the first scan coil 16a and the direction of deflection made by the second scan coil 16b are opposite to each other. Consequently, if a wide range is scanned, the beam B can be made to pass through the optical axis P of the objective lens 18 over the principal point of the objective lens 18 and, therefore, the effects of off-axial aberration in the objective lens 18 can be reduced. For example, if the axis of the beam B (central axis of scanning) deviates from the optical axis P of the objective lens 18, off-axial aberration in the objective lens 18 increases the probe diameter of the beam B over the sample S, thus deteriorating the image (scanned image).

As shown in FIG. 15A, in the charged particle beam system 200, the aperture 18a of the objective lens 18 is scanned with the charged particle beam B in the first scanning direction only with the first scan coil 16a without using the second scan coil 16b while the axis of the beam B is out of alignment with the optical axis P of the objective lens 18. For example, a one-dimensional scanning line is obtained by scanning the beam B in the +X-direction (first scanning direction) by the first scan coil 16a. The aperture 18a of the objective lens 18 is scanned in two dimensions by moving this scanning line in steps in the +Y-direction. As a result, as shown in FIG. 15B, an image I18a of the aperture 18a of the objective lens 18 is obtained. Positions a, b, c, and d in FIG. 15A correspond to positions a', b', c', and d', respectively, in the image of FIG. 15B. That is, the objective lens 18 operates as a shielding member that shields a part of the area scanned with the beam B. As shown in FIG. 15B, where a frame of image is scanned, for example, from left to right and image data is taken into the frame memory 32a, the image I18a of the aperture 18a of the objective lens 18 is shifted upwardly and leftwardly from the image center $O_I$. In FIG. 15B, the image I18a of the aperture 18a is dark, while the surroundings are bright. Where the detector 22 is located at a downstream-side from the objective lens 18 in an unillustrated manner, the image I18a of the aperture 18a is bright, while the surroundings are dark. The beam B is converged by the objective aperture 14 and aperture angle control lens 220, and scanned.

On the other hand, where the deviation between the axis of the charged particle beam B and the optical axis P of the objective lens 18 is the same as in the case of FIG. 15A as shown in FIG. 16A, the aperture 18a of the objective lens 18 is scanned with the beam B in the second scanning direction using only the second scan coil 16b without using the first scan coil 16a. For example, a one-dimensional scanning line is obtained by scanning the beam B in the −X-direction (second scanning direction) using the second scan coil 16b. This scanning line is moved in steps in the −Y-direction, thus scanning the aperture 18a of the objective lens 18 in two dimensions. Consequently, as shown in FIG. 16B, an image I18a of the aperture 18a of the objective lens 18 is obtained. Positions a, b, c, and d in FIG. 16A correspond to positions a', b', c', and d', respectively, in the image of FIG. 16B. Where a frame of image is scanned, for example, from left to right and image data is accepted into the frame memory 32a as shown in FIG. 16B, the image I18a of the aperture 18a of the objective lens 18 is shifted rightwardly and downwardly from the image center $O_I$. The image shown in FIG. 16B corresponds to an inverted image obtained by rotating the image shown in FIG. 15B through 180 degrees about the image center $O_I$. In this way, an image obtained by scanning the beam in the second scanning direction opposite to the first scanning direction is equivalent to an inverted image obtained by rotating the image, which is obtained by scanning in the first scanning direction, through 180 degrees about the image center $O_I$.

As shown in FIG. 17A, the axis of the charged particle beam B can be aligned with the optical axis P of the objective lens 18 by adjusting the excitation currents through the beam alignment coils 210a and 210b and deflecting the beam B. In a first scanning mode, the first scanning direction is employed using the first scan coil 16a. In a second scanning mode, the second scanning direction is employed using the second scan coil 16b. In these two scanning modes, the center of the image I18a of the aperture 18a of the objective lens 18 is coincident with the image center as shown in FIG. 17B. Accordingly, in the present embodiment, the beam B is axially aligned by finding values of excitation currents through the beam alignment coils 210a and 210b at which the center of the image I18a of the aperture 18a of the objective lens 18 is coincident with the image center $O_I$ in the first and second scanning modes.

Figures 18, 19:
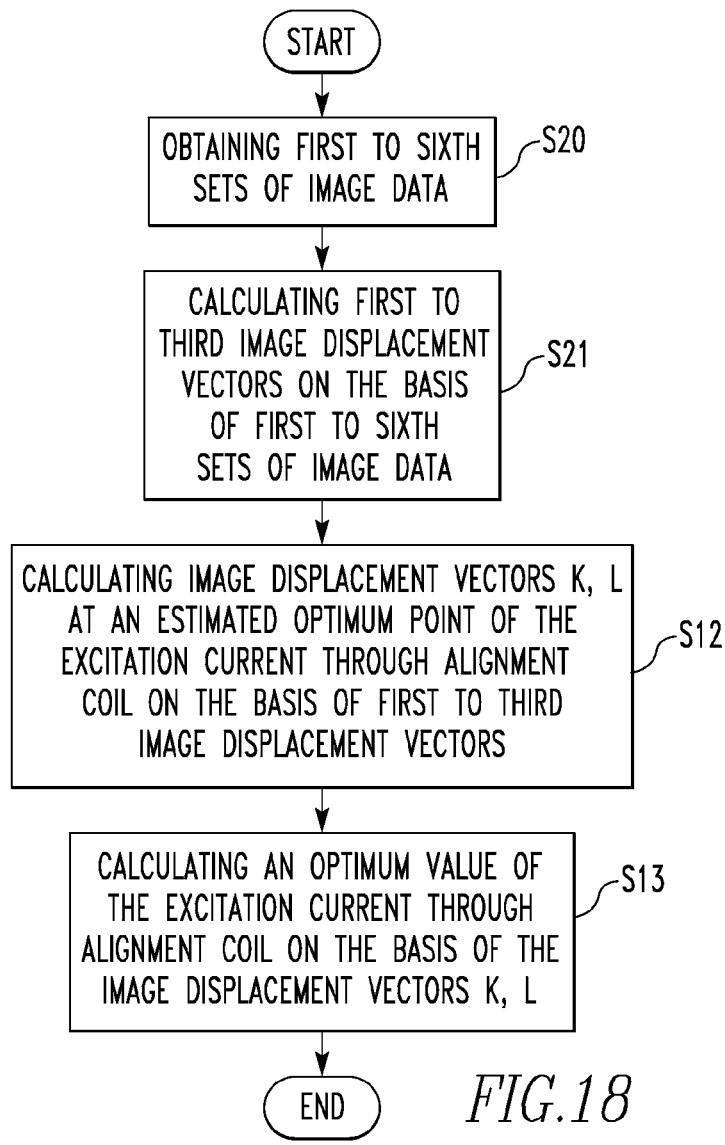
FIG. 18 is a flowchart illustrating a sequence of steps for axial alignment of a charged particle beam in accordance with the second embodiment.
FIG. 19 is a table illustrating shooting conditions under which frames 1-6 of images are taken.

FIG. 18 is a flowchart illustrating a sequence of operations performed by the charged particle beam system 200 associated with the present embodiment to make axial alignment.

First to sixth sets of image data are first obtained by the setting device 30 for setting shooting conditions for axial alignment (S20). The setting device 30 scans the charged particle beam B such that a shielded region is formed by shielding a part of the area scanned with the beam B by the objective lens 18. Frames 1-6 of images are taken by repeating the scanning while varying conditions of the excitation currents through the X beam alignment coil 210a and Y beam alignment coil 210b and switching the scan coil used for the scanning of the beam B between 16a and 16b. Thus, first to sixth sets of image data are derived. The frames 1-6 are images obtained by scanning a region including the aperture 18a of the objective lens 18 with the beam B. The frames 1-6 taken by the setting device 30 are stored as the first to sixth sets of image data in the frame memory 32a. Furthermore, the shooting conditions under which the frames 1-6 (indicated by first to sixth sets of image data) were taken are stored in the memory 32.

FIG. 19 is a table illustrating the shooting conditions under which frames of images are taken. The shooting conditions for each frame are given by (value of excitation current through the X beam alignment coil, value of excitation current through the Y beam alignment coil, and scan coil used to scan the charged particle beam B). For the frame 1, the conditions are (X=X0, Y=Y0, S1). For the frame 2, the conditions are (X=X0, Y=Y0+$\Delta$2, S1). For the frame 3, the conditions are (X=X0+$\Delta$1, Y=Y0, S1). For the frame 4, the conditions are (X=X0, Y=Y0, S2). For the frame 5, the conditions are (X=X0, Y=Y0+$\Delta$2, S2). For the frame 6, the conditions are (X=X0+$\Delta$1, Y=Y0, S2). During the capturing of the frames, in the charged particle beam system 200, conditions other than the values of the excitation currents through the beam alignment coils 210a and 210b and conditions for the selected scan coil 16a or 16b are not varied. That is, the frames are taken under conditions (area scanned with the beam and optical system of the charged particle beam system) similar to each other except for the values of the excitation currents through the beam alignment coils 210a and 210b and the selected scan coil.

The first current value X0 is the initial value of the excitation current through the X beam alignment coil 210a at the beginning of an axial alignment operation. The second current value Y0 is the initial value of the excitation current through the Y beam alignment coil 210b at the beginning of the axial alignment operation. The initial values X0 and Y0 may or may not be identical with each other. $\Delta$2 is a second incremental amount of current of the value of the excitation current through the Y beam alignment coil 210b. $\Delta$1 is a first incremental amount of current of the value of the excitation current through the X beam alignment coil 210a. The incremental amounts $\Delta$2 and $\Delta$1 may or may not be identical with each other. S1 shows a case where the beam B is scanned in the first scanning direction using only the first scan coil 16a and image data is obtained. S2 shows a case where the beam B is scanned in the second scanning direction and image data is obtained using only the second scan coil 16b. No restrictions are placed on the values of X0, Y0, $\Delta$2, and $\Delta$1. Rather, they can assume any arbitrary values.

In this step, the frame 1 (indicated by the first set of image data) is obtained under conditions where the value of the excitation current through the X beam alignment coil 210a is the initial value X0 and where the value of the excitation through the Y beam alignment coil 210b is Y0. The frame 2 (indicated by the second set of image data) is obtained under conditions where the value of the excitation current through the X beam alignment coil 210a is the initial value X0 and where the value of the excitation current through the Y beam alignment coil 210b is a current value Y0+$\Delta$2 obtained by varying the initial value Y0 by the second incremental amount of current $\Delta$2. The frame 3 (indicated by the third set of image data) is obtained under conditions where the value of the excitation current through the X beam alignment coil 210a is a current value X0+$\Delta$1 obtained by varying the initial value X0 by the first incremental amount of current $\Delta$1 and where the value of the excitation current through the Y beam alignment coil 210b is the initial value Y0. The first to third sets of image data are obtained by scanning the aperture 18a of the objective lens 18 in the first scanning direction.

The frame 4 (indicated by the fourth set of image data) is obtained under conditions where the value of the excitation current through the X beam alignment coil 210a is the initial value X0 and where the value of the excitation current through the Y beam alignment coil 210b is the initial value Y0. The frame 5 (indicated by the fifth set of image data) is obtained under conditions where the value of the excitation current through the X beam alignment coil 210a is the initial value X0 and where the value of the excitation current through the Y beam alignment coil 210b is a current value (Y0+$\Delta$2) obtained by varying the initial value Y0 by the second incremental amount of current $\Delta$2. The frame 6 (indicated by the sixth set of image data) is obtained under conditions where the value of the excitation current through the X beam alignment coil 210a is a current value (X0+$\Delta$1) obtained by varying the initial value X0 by the first incremental amount of current $\Delta$1 and where the value of the excitation current through the Y beam alignment coil 210b is the initial value Y0. The fourth to sixth sets of image data are derived by scanning the aperture 18a of the objective lens 18 in the second scanning direction. The frame 4 obtained in this way is equivalent to an inverted image of frame 1. The frame 5 is equivalent to an inverted image of frame 2. The frame 6 is equivalent to an inverted image of frame 3.

The image displacement vector calculator 34 then calculates the first image displacement vector A (a, b) indicative of the amount of positional deviation between the frame 1 of image indicated by the first set of image data and the frame 4 of image indicated by the fourth set of image data, both images corresponding to the aperture 18a of the objective lens 18. Furthermore, the vector calculator 34 computes the second image displacement vector B (c, d) indicative of the amount of positional deviation between the frame 2 of image indicated by the second set of image data and the frame 5 of image indicated by the fifth set of image data, both images corresponding to the aperture 18a of the objective lens 18. In addition, the vector calculator 34 calculates the third image displacement vector C (e, f) indicative of the amount of positional deviation between the frame 3 of image indicated by the third set of image data and the frame 6 of image indicated by the sixth set of image data, both images corresponding to the aperture 18a of the objective lens 18 (S21).

The image displacement vectors A-C correspond to the image displacement vectors A-C, respectively, of the above-described first embodiment. Therefore, subsequent steps S12-S13 are the same as their counterparts of the first embodiment and their description is omitted.

In the present embodiment, optimum values X3 and Y3 of the excitation currents through the beam alignment coils 210a and 210b, respectively, can be found from the six sets of image data (frames 1-6) as described previously. According to the present embodiment, only a limited number of sets of image data need to be derived for axial alignment of a charged particle beam in this way. Hence, it is easy to make axial alignment of the beam. This reduces the burden on the operator of the system. The time taken to make axial alignment of the beam can be shortened.

The charged particle beam system associated with the present embodiment has the axial alignment shooting condition setting device 30 for scanning the charged particle beam B such that a part of the area scanned with the beam B is shielded to thereby form a shielded region and repeating the scanning while varying conditions of the excitation currents through the X beam alignment coil 210*a* and the Y beam alignment coil 210*b* to thereby obtain first to sixth sets of image data, the image displacement vector calculator 34 for calculating the first to third image displacement vectors A-C based on the first to sixth sets of image data, and the optimum value calculator 36 for calculating the values X3 and Y3 of the excitation currents through the beam alignment coils 210*a* and 210*b* for axial alignment of the beam based on the first to third image displacement vectors. Consequently, the beam can be axially aligned easily. Furthermore, the axial alignment of the beam B can be automated.

2.3. Modifications

Modifications of the method of making axial alignment of the charged particle beam in the charged particle beam system associated with the present embodiment are next described.

2.3.1 First Modification

A first modification is first described.

In the second embodiment described above, the image displacement vector calculator 34 calculates the first to third image displacement vectors A-C indicative of the amounts of positional deviations between the frames (indicated by the first to third sets of image data) obtained by scanning the charged particle beam B in the first scanning direction and the frames (indicated by the fourth to sixth sets of image data) obtained by scanning the beam B in the second scanning direction, the images corresponding to the aperture 18*a* of the objective lens 18 (S21).

In contrast, in the first modification, the setting device 30 for setting shooting conditions for axial alignment obtains only the first to third sets of image data. The image displacement vector calculator 34 calculates a vector connecting the center of an image corresponding to the aperture 18*a* of the objective lens 18 in the frame 1 (indicated by the first set of image data) with the image center of the frame 1 as the first image displacement vector A, calculates a vector connecting the center of an image corresponding to the aperture 18*a* of the objective lens 18 in the frame 2 (indicated by the second set of image data) with the image center of the frame 2 as the second image displacement vector B, and calculates a vector connecting the center of an image corresponding to the aperture 18*a* of the objective lens 18 in the frame 3 (indicated by the third set of image data) with the image center of the frame 3 as the third image displacement vector C.

Subsequent steps S12-S13 are the same as their counterparts of the above-described first embodiment and their description is omitted.

The setting device 30 for setting shooting conditions for axial alignment may obtain only the fourth to sixth sets of image data. The image displacement vector calculator 34 may calculate a vector connecting the center of an image corresponding to the aperture 18*a* of the objective lens 18 in the frame 4 (indicated by the fourth set of image data) with the image center of the frame 4 as the first image displacement vector A, calculate a vector connecting the center of an image corresponding to the aperture 18*a* of the objective lens 18 in the frame 5 (indicated by the fifth set of image data) with the image center of the frame 5 as the second image displacement vector B, and calculate a vector connecting the center of an image corresponding to the aperture 18*a* of the objective lens 18 in the frame 6 (indicated by the sixth set of image data) with the image center of the frame 6 as the third image displacement vector C.

In this modification, the charged particle beam can be axially aligned easily in the same way as in the above-described second embodiment.

2.3.2 Second Modification

A second modification is next described.

In the above-described second embodiment, the image displacement vector calculator 34 calculates the first to third image displacement vectors A-C indicative of the amounts of positional deviations between the frames (indicated by the first to third sets of image data) obtained by scanning the charged particle beam B in the first scanning direction and the frames (indicated by the fourth to sixth sets of image data) obtained by scanning the beam B in the second scanning direction, the images corresponding to the aperture 18*a* of the objective lens 18 (S21).

In contrast, in the second modification, the setting device 30 for setting shooting conditions for axial alignment obtains only the first to third sets of image data. The image displacement vector calculator 34 generates inverted images of non-inverted images from the first to third sets of image data, calculates the first image displacement vector A based on the frame 1 of image indicated by the first set of image data and on an inverted image of the frame 1, calculates the second image displacement vector B based on the frame 2 indicated by the second set of image data and on an inverted image of the frame 2, and calculates the third image displacement vector C based on the frame 3 indicated by the third set of image data and on an inverted image of the frame 3.

The setting device 30 for setting shooting conditions for axial alignment may obtain only the fourth to sixth sets of image data. The image displacement vector calculator 34 may generate inverted images of images indicated by the fourth to sixth sets of image data, calculate the first image displacement vector A based on the frame 4 indicated by the fourth set of image data and on the inverted image of the frame 4, calculate the second image displacement vector B based on the frame 5 indicated by the fifth set of image data and on the inverted image of the frame 5, and calculate the third image displacement vector C based on the frame 6 indicated by the sixth set of image data and on the inverted image of the frame 6.

According to this medication, a charge particle beam can be easily aligned axially in the same way as in the above-described second embodiment.

2.3.3 Third Modification

A third modification is next described.

In the second embodiment, the setting device 30 for setting shooting conditions for axial alignment scans the charged particle beam B in the first scanning direction by the first scan coil 16*a*, obtains first to third sets of image data, scans the beam B in the second scanning direction opposite to the first scanning direction by the second scan coil 16*b*, and obtains fourth to sixth sets of image data.

In contrast, in this modification, the setting device 30 for setting shooting conditions for axial alignment may first scan the charged particle beam B in the first scanning direction by the first scan coil 16*a*, obtain first to third sets of image data, then reverse the current polarity of the scan signal for the first scan coil 16*a* to vary the scanning direction of the beam B by the first scan coil 16*a* to the second scanning direction, and obtain fourth to sixth sets of image data.

According to this modification, the charged particle beam can be easily aligned axially in the same way as in the above-described second embodiment.

2.3.4 Fourth Modification

Figure 20:
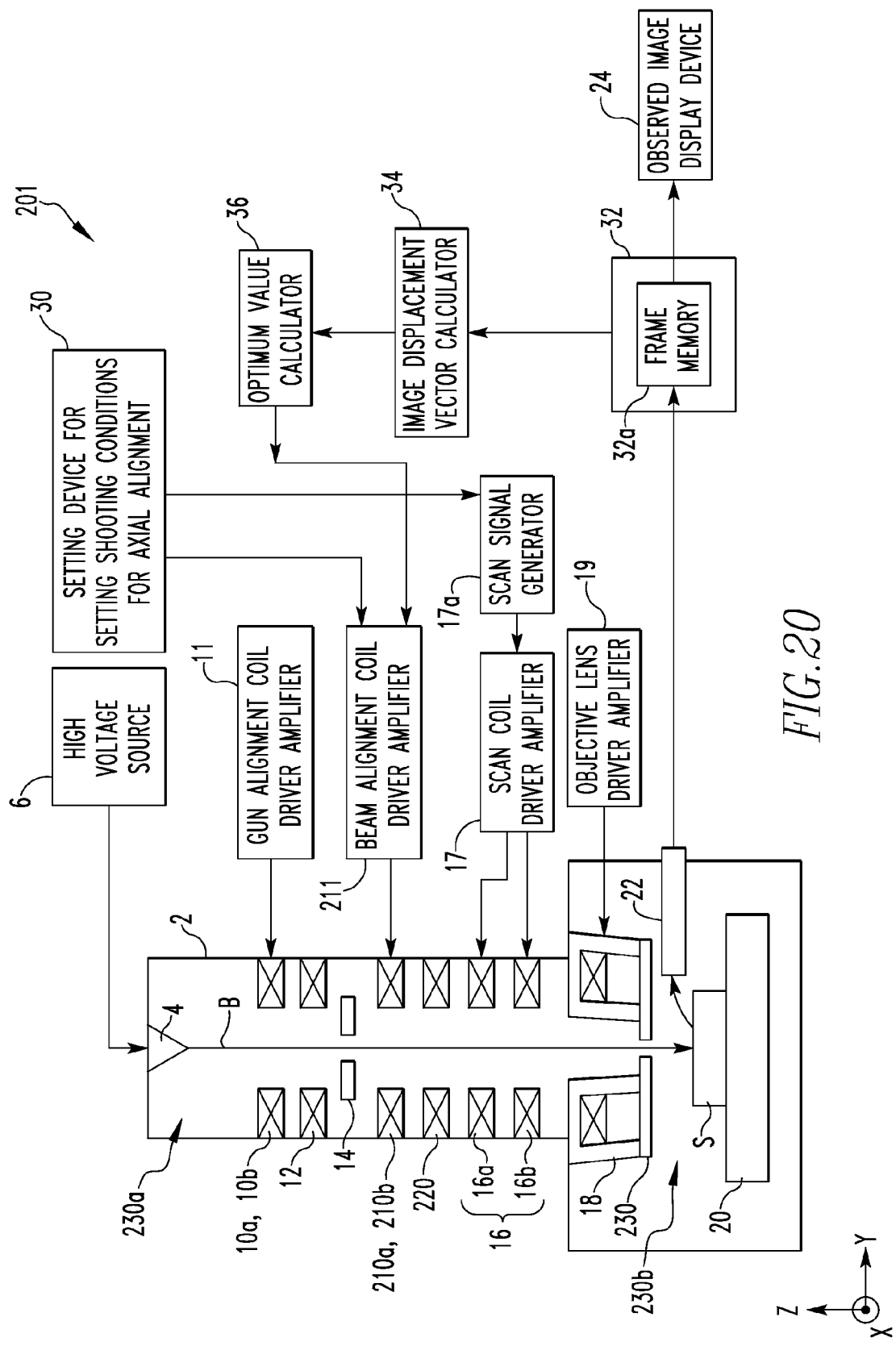
FIG. 20 is a block diagram of a charged particle beam system associated with a fourth modification of the second embodiment, showing the configuration of the system.

A fourth modification is next described. FIG. 20 shows the configuration of a charged particle beam system 201 associated with the fourth modification. The components of the beam system 201 which are functionally similar to their counterparts of the above-described charged particle beam system 100 or 200 are indicated by the same reference numerals as in the already referenced figures and their detailed description is omitted.

In the above-described charged particle beam system 200 associated with the second embodiment, the charged particle beam B is axially aligned by aligning the axis of the beam B with the optical axis of the objective lens 18.

In contrast, the charged particle beam system 201 is configured including an orifice 230 in addition to the components of the charged particle beam system 100. The beam B is axially aligned by aligning the axis of the beam B with the central axis of the aperture of the orifice 230. That is, the orifice 230 acts as a shielding member that shields a part of the region scanned with the beam B.

The orifice 230 is located at a downstream-side from the objective lens 18 and placed in the path of the charged particle beam B. The orifice 230 has an aperture (aperture hole) permitting passage of the beam B and creates a pressure difference when differential pumping is done. For example, a chamber having a pressure difference is interfaced, a flow of gas molecules is produced according to the pressure difference. If the orifice 230 is placed in between, the orifice shows resistance against the flow and so the pressure difference can be maintained. In the illustrated example, the orifice 230 is disposed between a space 230a where electron optics such as the objective lens 18 are placed and a sample chamber 230b where the sample S is placed. A pressure difference is created between the space 230a and the sample chamber 230b. For example, the charged particle beam system 201 is a low-pressure SEM having a pressure difference between the space 230a where the electron optics are placed and the sample chamber 230b.

The charged particle beam system 201 is similar in operation to the above-described charged particle beam system 200 except that the aperture of the orifice 230 is used instead of the aperture 18a of the objective lens 18 and a description of the operation is omitted.

2.3.5 Fifth Modification

Figure 21:
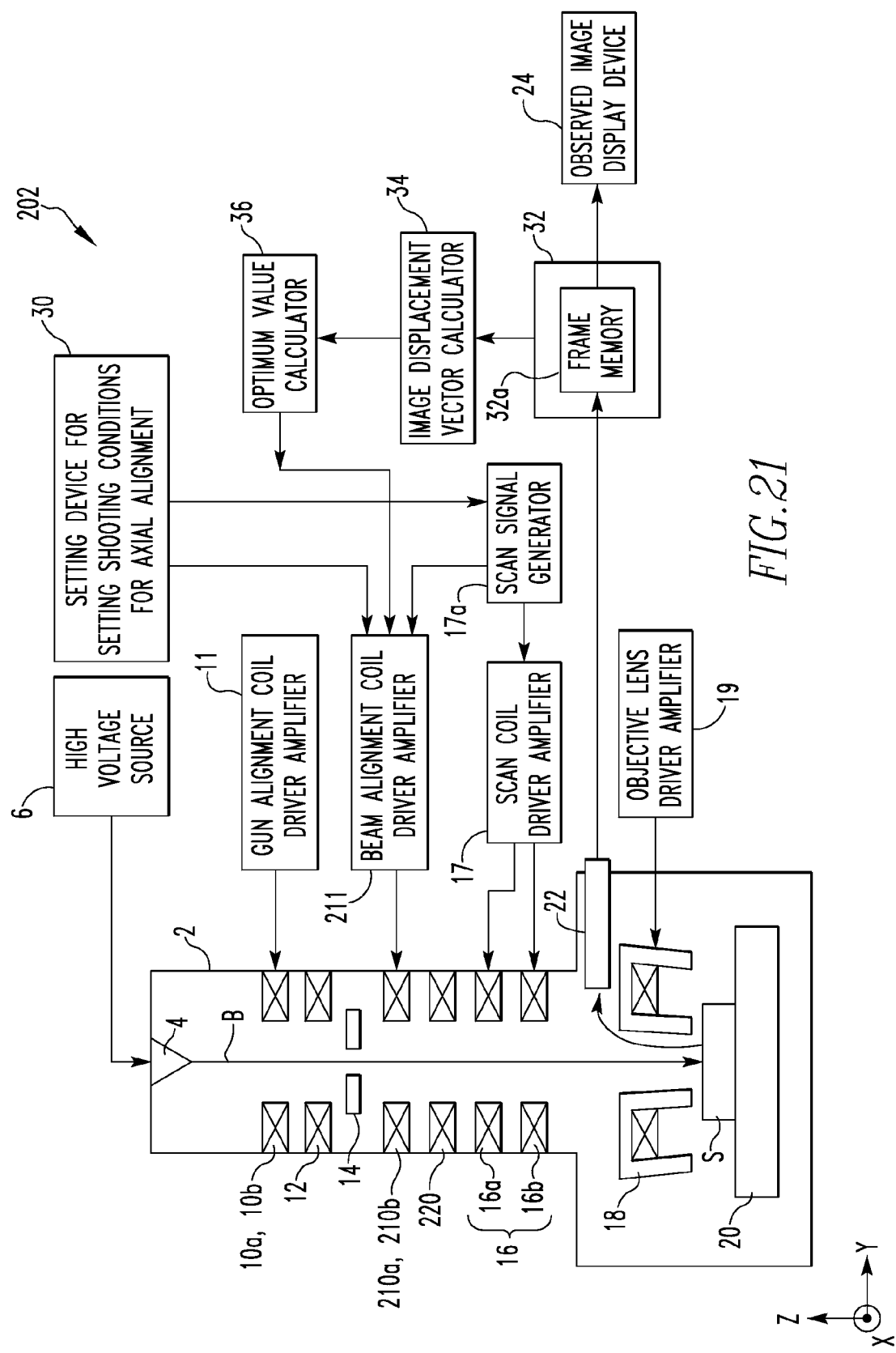
FIG. 21 is a block diagram of a charged particle beam system associated with a fifth modification of the second embodiment, showing the configuration of the system.

A fifth modification is next described. FIG. 21 shows the configuration of a charged particle beam system 202 associated with the fifth modification. Those components of the system 202 which are similar in function with their counterparts of the charged particle beam system 100 or 200 are indicated by the same reference numerals as in the already referenced figures and their detailed description is omitted.

In the above-described charged particle beam system 200, the setting device 30 for setting shooting conditions for axial alignment scans the charged particle beam B by the scan coil 16a and 16b such that a part of the area scanned with the beam B is shielded by the objective lens 18 to form a shielded region, and obtains image data.

In contrast, in the charged particle beam system 202, the setting device 30 for setting shooting conditions for axial alignment scans the charged particle beam B by beam alignment coils 210a and 210b without scanning the beam B using the scan coils 16a and 16b such that a part of the area scanned with the beam B is shielded by the objective lens 18 to form a shielded region, and obtains image data.

In the charged particle beam system 202, the scan signal generator 17a is connected with the beam alignment coil driver amplifier 211 and can supply a scan signal to this amplifier 211. Therefore, in the excitation currents through the beam alignment coils 210a and 210b, scan signal components are added to DC components set by the setting device 30 for setting shooting conditions for axial alignment. In the beam system 202, the setting device 30 supplies signals corresponding to the DC components of the excitation currents through the beam alignment coils 210a and 210b, and the scan signal generator 17a supplies a scan signal corresponding to the scan signal components of the excitation currents through the beam alignment coils 210a and 210b.

In the charged particle beam system 202, the setting device 30 for setting shooting conditions for axial alignment first scans the charged particle beam B in the first scanning direction by the beam alignment coils 210a and 210b, obtains first to third sets of image data, then reverses the current polarity of the scanning signals supplied to the beam alignment coils 210a and 210b such that the direction in which the beam B is scanned using the beam alignment coils 210a and 210b is varied to the second scanning direction, and obtains fourth to sixth sets of image data in the same way as in the third modification of the aforementioned second embodiment. Subsequent steps are the same as their counterparts of the above-described second embodiment and so their description is omitted.

3. Third Embodiment

A charged particle beam system associated with a third embodiment of the invention is next described.

In the above-described example of charged particle beam system 100 associated with the first embodiment, the charged particle beam B is axially aligned by aligning the axis of the beam B with the central axis of the objective aperture 14 using the gun alignment coils 10a and 10b. Furthermore, in the charged particle beam system 200 associated with the second embodiment, the charged particle beam B is axially aligned by aligning the axis of the beam B passed through the objective aperture 14 with the optical axis of the objective lens 18 using the beam alignment coils 210a and 210b.

In contrast, in a charged particle beam system 200 associated with the third embodiment, the charged particle beam B is axially aligned by aligning the axis of the beam B with the optical axis of the objective lens 18 using the gun alignment coils 10a and 10b.

The charged particle beam system associated with the third embodiment is similar in configuration with the charged particle beam system 200 associated with the second embodiment and so its description is omitted.

Figure 22:
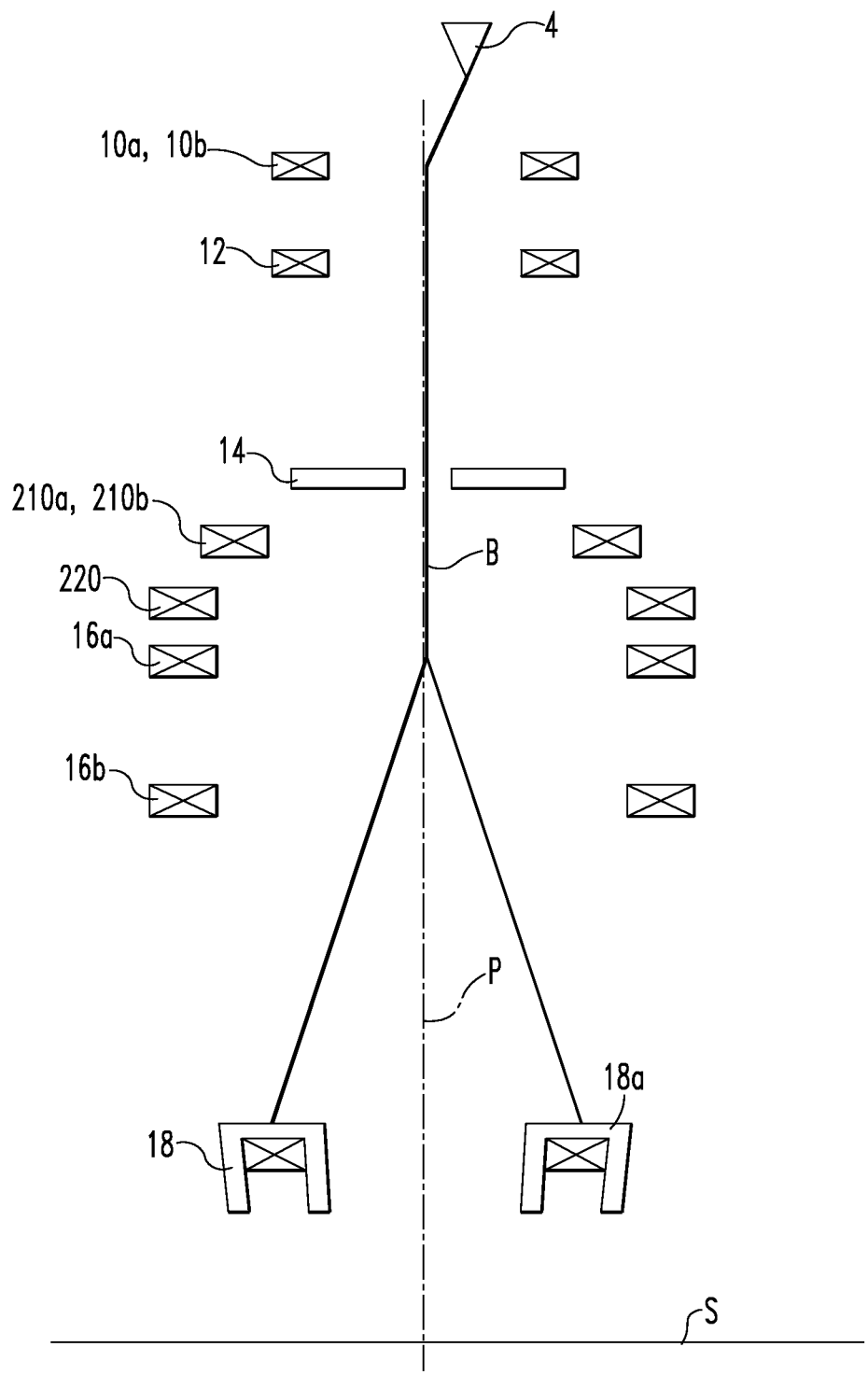
FIG. 22 is a ray diagram illustrating a method of making axial alignment of a charged particle beam in accordance with a third embodiment of the invention.

FIG. 22 illustrates a method of making axial alignment by the charged particle beam system associated with the present embodiment.

Referring to FIG. 22, in the charged particle beam system 200, the axis of the charged particle beam B can be aligned with the optical axis P of the objective lens 18 by adjusting the excitation currents through the gun alignment coils 10a and 10b and deflecting the beam B. In the present embodiment, the beam B is axially aligned by finding the values of excitation currents through the gun alignment coils 10a and 10b at which the center of an image of the aperture 18a of the objective lens 18 is coincident with the image center in two scanning modes in the same way as in the second embodiment. In one of the scanning modes, the beam is scanned in the first scanning direction using the first scan coil 16a. In the other scanning mode, the beam is scanned in the second scanning direction using the second scan coil 16b.

First to sixth sets of image data are first obtained by the setting device 30 for setting shooting conditions for axial alignment. The setting device 30 scans the charged particle beam B such that a part of the area scanned with the beam B is shielded by the objective lens 28 to thereby form a shielded region. The setting device repeats the scanning while varying conditions of the excitation currents through the X gun alignment coil 10a and the Y gun alignment coil 10b and switching the scan coil used for scanning the beam B between 16a and 16b. Thus, frames 1-6 are taken and first to sixth sets of image data are obtained. The frames 1-6 are images by scanning the aperture 18a of the objective lens 18 with the beam B. The frames 1-6 taken by the setting device 30 are stored as first to sixth sets of image data in the frame memory 32a. Also, the shooting conditions under which the frames 1-6 (indicated by the first to sixth sets of image data) were taken are stored in the memory 32.

The shooting conditions for each frame are given by (value of excitation current through the X gun alignment coil, value of excitation current through the Y gun alignment coil, and scan coil used to scan the charged particle beam B). For the frame 1, the shooting conditions are (X=X0, Y=Y0, S1). For the frame 2, the shooting conditions are (X=X0, Y=Y+Δ2, S1). For the frame 3, the shooting conditions are (X=X0+Δ1, Y=Y0, S1). For the frame 4, the shooting conditions are (X=X0, Y=Y0, S2). For the frame 5, the shooting conditions are (X=X0, Y=Y+Δ2, S2). For the frame 6, the shooting conditions are (X=X0+Δ1, Y=Y0, S2). The frame 4 is equivalent to an inverted image of the frame 1. The frame 5 is equivalent to an inverted image of the frame 2. The frame 6 is equivalent to an inverted image of the frame 3. During capturing of each frame, the excitation conditions for the condenser lenses 12, aperture angle control lens 220, and objective lens 18 are the same as the conditions for normal observation of samples. Furthermore, the excitation currents through the beam alignment coils 210a and 210b are constant, for example, equal to 0.

The image displacement vector calculator 34 calculates the first image displacement vector A (a, b) indicative of the amount of positional deviation between the image (frame 1) indicated by the first set of image data and the image (frame 4) indicated by the fourth set of image data, the images corresponding to the aperture 18a of the objective lens 18. Furthermore, the vector calculator 34 computes the second image displacement vector B (c, d) indicative of the amount of positional deviation between the image (frame 2) indicated by the second set of image data and the image (frame 5) indicated by the fifth set of image data, the images corresponding to the aperture 18a of the objective lens 18. In addition, the vector calculator 34 calculates the third image displacement vector C (e, f) indicative of the amount of positional deviation between the image (frame 3) indicated by the third set of image data and the image (frame 6) indicated by the sixth set of image data, the images corresponding to the aperture 18a of the objective lens 18.

The image displacement vectors A-C correspond to the image displacement vectors A-C, respectively, of the first embodiment. Accordingly, subsequent steps are the same as their counterparts of the above-described first embodiment and their description is omitted.

In the present embodiment, optimum values of the excitation currents through the gun alignment coils 10a and 10b, respectively, can be found from the 6 sets of image data (frames 1-6) as described previously. According to the present embodiment, only a limited number of sets of image data need to be derived for axial alignment of the charged particle beam in this way. Therefore, it is easy to make axial alignment of the beam. Consequently, the burden on the operator of the system is reduced. The time taken to make axial alignment of the beam can be shortened.

It is to be understood that the above-described embodiments are merely exemplary and the present invention are not restricted thereto. For example, plural ones of the embodiments may be appropriately combined.

For instance, the functions of the axial alignment shooting condition setting device 30, image displacement vector calculator 34, and optimum value calculator 36 may be implemented by hardware such as various processors (e.g., CPU and DSP) or ASIC (such as a gate array) or by software.

The present invention embraces configurations substantially identical (e.g., in function, method, and results or in purpose and advantageous effects) with the configurations described in the above embodiments of the invention. Furthermore, the invention embraces configurations described in the embodiments and including portions which have nonessential portions replaced. In addition, the invention embraces configurations described in the preferred same advantageous effects as those produced by the configurations described in the preferred embodiments or which can achieve the same objects as the configurations described in the preferred embodiments. Further, the invention embraces configurations which are similar to the configurations described in the preferred embodiments except that well-known techniques have been added.

Having thus described our invention with the detail and particularity required by the Patent Laws, what is desired protected by Letters Patent is set forth in the following claims.

The invention claimed is:

1. A method of making axial alignment of a charged particle beam in a charged particle beam system having a first alignment coil for deflecting the beam in a first direction, a second alignment coil for deflecting the beam in a second direction crossing the first direction and an objective lens for focusing the beam onto an object, and operating to adjust the axis of the beam by means of the first and second alignment coils, to detect a signal emanating from the object and to obtain image data, said method comprising the steps of obtaining at least first to third sets of image data by scanning the beam on a scanning area including a shielded region and repeating the scanning while varying conditions of excitation currents flowing through the first and second alignment coils, respectively; and calculating the values of the excitation currents through the first and second alignment coils, respectively, for axial alignment of the beam based on the obtained first to third sets of image data, wherein during the step of obtaining the at least first to third sets of image data, the first set of image data is obtained under conditions where the value of the excitation current through the first alignment coil is a first current value and where the value of the excitation current through the second alignment coil is a second current value, the second set of image data is obtained under conditions where the value of the excitation current through the first alignment coil is the first current value and where the value of the excitation current through the second alignment coil is a current value obtained by varying the second current value by a second incremental amount of current, and the third set of image data is obtained under conditions where the value of the excitation current through the first alignment coil is a current value obtained by varying the first current value by a first incremental amount of current and where the value of the excitation current through the second alignment coil is the second current value.

2. The method of making axial alignment of a charged particle beam as set forth in claim 1, wherein during said step of calculating values of the excitation currents, a first image displacement vector indicative of an amount of positional deviation between a first image formed by said shielded region and indicated by said first set of image data and an image obtained by rotating the first image through 180 degrees about an image center, a second image displacement vector indicative of an amount of positional deviation between a second image formed by said shielded region and indicated by said second set of image data and an image obtained by rotating the second image through 180 degrees about an image center, and a third image displacement vector indicative of an amount of positional deviation between a third image formed by said shielded region and indicated by said third set of image data and an image obtained by rotating the third image through 180 degrees about an image center, and wherein the values of the excitation currents through the first and second alignment coils, respectively, for axial alignment of the beam are calculated based on the first to third image displacement vectors.

3. The method of making axial alignment of a charged particle beam as set forth in claim 1,
wherein said charged particle beam system has scan coils for scanning the charged particle beam when said image data are obtained,
wherein during said step of obtaining the at least first to third sets of image data, fourth to sixth sets of image data are obtained, the fourth set of image data being obtained under conditions where the value of the excitation current through the first alignment coil is said first current value and where the value of the excitation current through the second alignment coil is said second current value, said fifth set of image data being obtained under conditions where the value of the excitation current through the first alignment coil is said first current value and where the value of the excitation current through the second alignment coil is a current value obtained by varying the second current value by said second incremental amount of current, the sixth set of image data being obtained under conditions where the value of the excitation current through the first alignment coil is a current value obtained by varying said first current value by said first incremental amount of current and where the value of the excitation current through the second alignment coil is said second current value;
wherein said first to third sets of image data are obtained by scanning the charged particle beam in a first scanning direction by means of said scan coils;
wherein said fourth to sixth sets of image data are obtained by scanning the beam in a second scanning direction opposite to the first scanning direction by the scan coils; and
wherein during said step of calculating the values of the excitation currents, the values of the excitation currents through the first and second alignment coils, respectively, for axial alignment of the beam are calculated based on the first to sixth sets of image data.

4. The method of making axial alignment of a charged particle beam as set forth in any one of claims 1 to 3, wherein said objective lens has an aperture for permitting passage of said charged particle beam, and wherein said shielded region is formed by the objective lens.

5. The method of making axial alignment of a charged particle beam as set forth in any one of claims 1 to 3, wherein said shielded region is formed by an orifice for creating a pressure difference between a space where said objective lens is placed and a space where a sample is placed.

6. The method of making axial alignment of a charged particle beam as set forth in any one of claims 1 to 3, wherein said shielded region is formed by an objective aperture for restricting the charged particle beam traveling for said objective lens.

7. The method of making axial alignment of a charged particle beam as set forth in any one of claims 1 to 3, wherein said shielded region is formed by a charged particle beam detection aperture for detecting variations in said charged particle beam.

8. The method of making axial alignment of a charged particle beam as set forth in any one of claims 1 to 3, wherein said first and second alignment coils are disposed at an upstream-side from an objective aperture for restricting said charged particle beam traveling for said objective lens.

9. The method of making axial alignment of a charged particle beam as set forth in any one of claims 1 to 3, wherein said first and second alignment coils are disposed at a downstream-side from an objective aperture for restricting said charged particle beam traveling for said objective lens.

10. A charged particle beam system having a first alignment coil for deflecting a charged particle beam in a first direction, a second alignment coil for deflecting the beam in a second direction crossing the first direction and an objective lens for focusing the beam onto an object, and operating to adjust the axis of the beam by means of the first and second alignment coils, to detect a signal emanating from the object and to obtain image data, said charged particle beam system comprising:
image data acquisition means for obtaining at least first to third sets of image data by scanning the beam on a scanning area including a shielded region and repeating the scanning while varying conditions of excitation currents through the first and second alignment coils, respectively; and
calculation means for calculating the values of the excitation currents through the first and second alignment coils, respectively, for axial alignment of the beam based on the first to third sets of image data obtained by said image data acquisition means;
wherein said first set of image data is obtained under conditions where the value of the excitation current through the first alignment coil is a first current value and where the value of the excitation current through the second alignment coil is a second current value;
wherein said second set of image data is obtained under conditions where the value of the excitation current through the first alignment coil is said first current value and where the value of the excitation current through the second alignment coil is a current value obtained by varying said second current value by a second incremental amount of current; and
wherein said third set of image data is obtained under conditions where the value of the excitation current through the first alignment coil is said first current value and varying said first current value by a first incremental amount of current and where the value of the excitation current through the second alignment coil is said second current value.

11. The charged particle beam system as set forth in claim 10, wherein said calculation means calculates a first image displacement vector indicative of an amount of positional deviation between a first image formed by said shielded region and indicated by said first set of image data and an image obtained by rotating the first image through 180 degrees about an image center, a second image displacement vector indicative of an amount of positional deviation between a second image formed by said shielded region and indicated by said second set of image data and an image obtained by rotating the second image through 180 degrees about an image center, and a third image displacement vector indicative of an amount of positional deviation between a third image formed by said shielded region and indicated by said third set of image data and an image obtained by rotating the third image through 180 degrees about an image center, and wherein the values of the excitation currents through the first and second alignment coils, respectively, for axial alignment of the charged particle beam are calculated based on the first to third image displacement vectors.

12. The charged particle beam system as set forth in claim 10, wherein there are further provided scan coils for scanning said charged particle beam when said image data are obtained, wherein said image data acquisition means obtains fourth to sixth sets of image data, said fourth set of image data being obtained under conditions where the value of the excitation current through said first alignment coil is said first current value and where the value of the excitation current through said second alignment coil is said second current value, said fifth set of image data being obtained under conditions where the value of the excitation current through said first alignment coil is said first current value and where the value of the excitation current through said second alignment coil is a current value obtained by varying said second current value by said second incremental amount of current, said sixth set of image data being obtained under conditions where the value of the excitation current through said first alignment coil is a current value obtained by varying said first current value by said first incremental amount of current and where the value of the excitation current wherein said first to third sets of image data are obtained by scanning the charged particle beam in a first scanning direction using said scan coils and said fourth to sixth sets of image data are obtained by scanning the beam in a second scanning direction opposite to said first scanning direction using said scan coils; and wherein said calculation means calculates the values of the excitation currents through the first and second alignment coils, respectively, for axial alignment of the beam based on the first to sixth sets of image data.

13. The charged particle beam system as set forth in any one of claims 10 to 12, wherein said objective lens has an aperture for permitting passage of said charged particle beam, and wherein said shielded region is formed by the objective lens.

14. The charged particle beam system as set forth in any one of claims 10 to 12, wherein said shielded region is formed by an orifice for creating a pressure difference between a space where said objective lens is placed and a space where a sample is placed.

15. The charged particle beam system as set forth in any one of claims 10 to 12, wherein said shielded region is formed by an objective aperture for restricting the charged particle beam traveling for said objective lens.

16. The charged particle beam system as set forth in any one of claims 10 to 12, wherein said shielded region is formed by a charged particle beam detection aperture for detecting variations in said charged particle beam.

17. The charged particle beam system as set forth in any one of claims 10 to 12, wherein said first alignment coil and said second alignment coil are disposed at an upstream-side from an objective aperture for restricting said charged particle beam impinging on said objective lens.

18. The charged particle beam system as set forth in any one of claims 10 to 12, wherein said first alignment coil and said second alignment coil are disposed at a downstream-side from an objective aperture for restricting said charged particle beam impinging on said objective lens.

* * * * *

UNITED STATES PATENT AND TRADEMARK OFFICE
CERTIFICATE OF CORRECTION

PATENT NO.        : 8,742,343 B2
APPLICATION NO.   : 13/908345
DATED             : June 3, 2014
INVENTOR(S)       : Mitsuru Yamada et al.

It is certified that error appears in the above-identified patent and that said Letters Patent is hereby corrected as shown below:

In the Claims

Column 30, Line 61, Claim 10, delete "is said first" and insert -- is a --

Column 30, Lines 61-62, Claim 10, delete "value and" and insert -- value obtained by --

Column 32, Line 2, Claim 12, after "current" insert -- through said second alignment coil is said second current value; --

Signed and Sealed this
Sixteenth Day of September, 2014

Michelle K. Lee
*Deputy Director of the United States Patent and Trademark Office*